(12) United States Patent
Yamazaki et al.

(10) Patent No.: US 12,100,747 B2
(45) Date of Patent: Sep. 24, 2024

(54) SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yukinori Shima, Gunma (JP); Masataka Nakada, Tochigi (JP); Takumi Shigenobu, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 583 days.

(21) Appl. No.: 17/286,530

(22) PCT Filed: Oct. 28, 2019

(86) PCT No.: PCT/IB2019/059207
§ 371 (c)(1),
(2) Date: Apr. 19, 2021

(87) PCT Pub. No.: WO2020/089762
PCT Pub. Date: May 7, 2020

(65) Prior Publication Data
US 2021/0384314 A1    Dec. 9, 2021

(30) Foreign Application Priority Data
Nov. 2, 2018   (JP) ................................. 2018-207250

(51) Int. Cl.
*H01L 29/49* (2006.01)
*H01L 29/423* (2006.01)
(Continued)

(52) U.S. Cl.
CPC .... *H01L 29/4908* (2013.01); *H01L 29/42384* (2013.01); *H01L 29/66969* (2013.01);
(Continued)

(58) Field of Classification Search
CPC ........... H01L 29/4908; H01L 29/42384; H01L 29/7869
See application file for complete search history.

(56) References Cited

U.S. PATENT DOCUMENTS 7,728,328 B2   6/2010   Kwak
7,800,098 B2   9/2010   Kwak
(Continued)

FOREIGN PATENT DOCUMENTS

CN   001991451 A   7/2007
CN   104821338 A   8/2015
(Continued)

OTHER PUBLICATIONS

International Search Report (Application No. PCT/IB2019/059207) Dated Jan. 28, 2020.
(Continued)

*Primary Examiner* — Michele Fan
(74) *Attorney, Agent, or Firm* — NIXON PEABODY LLP; Jeffrey L. Costellia

(57) ABSTRACT

A semiconductor device with favorable electrical characteristics is provided. A semiconductor device capable of high-voltage driving is provided. A semiconductor device in which a large amount of current can flow is provided. The semiconductor device has a structure including a semiconductor layer, a first insulating layer, a second insulating layer, a metal oxide layer, a conductive layer, and an insulating region. The metal oxide layer is positioned between the first insulating layer and the conductive layer. The insulating region is adjacent to the metal oxide layer and is positioned between the first insulating layer and the conductive layer. The semiconductor layer includes a first region in contact with the first insulating layer and overlapping with the metal oxide layer and the conductive layer with the first insulating layer therebetween, a second region
(Continued)

in contact with the first insulating layer and overlapping with the insulating region and the conductive layer with the first insulating layer therebetween, a third region in contact with the first insulating layer, and a fourth region in contact with the second insulating layer. The insulating region shows a different permittivity from the first insulating layer.

7 Claims, 24 Drawing Sheets

(51) Int. Cl.
    *H01L 29/66*   (2006.01)
    *G02F 1/1368*  (2006.01)
    *H01L 29/786*  (2006.01)
    *H10K 59/12*   (2023.01)
(52) U.S. Cl.
    CPC .............................. *G02F 1/13685* (2021.01);
        *H01L 2029/42388* (2013.01); *H01L 29/7869*
        (2013.01); *H10K 59/12* (2023.02)

(56) References Cited

U.S. PATENT DOCUMENTS

| | | | |
|---|---|---|---|
| 9,443,876 | B2 | 9/2016 | Yamazaki et al. |
| 9,496,408 | B2 | 11/2016 | Yamazaki et al. |
| 9,634,149 | B2 | 4/2017 | Endo et al. |
| 9,954,058 | B1 * | 4/2018 | Mochizuki ........ H01L 29/42392 |
| 10,249,645 | B2 | 4/2019 | Yamazaki et al. |
| 10,361,290 | B2 | 7/2019 | Yamazaki et al. |
| 10,699,904 | B2 | 6/2020 | Endo et al. |
| 10,811,435 | B2 | 10/2020 | Yamazaki et al. |
| 2002/0024298 | A1 | 2/2002 | Fukunaga |
| 2003/0218222 | A1 | 11/2003 | Wager, III et al. |
| 2007/0145369 | A1 | 6/2007 | Kwak |
| 2009/0202743 | A1 | 8/2009 | Schaepkens et al. |
| 2011/0263083 | A1 | 10/2011 | Yamazaki |
| 2012/0001167 | A1 | 1/2012 | Morosawa |
| 2012/0112182 | A1 | 5/2012 | Ishii et al. |
| 2012/0112184 | A1 | 5/2012 | Yamazaki et al. |
| 2012/0313152 | A1 | 12/2012 | Yokoi et al. |
| 2013/0052799 | A1 | 2/2013 | Ohki |
| 2013/0164920 | A1 | 6/2013 | Yamazaki |
| 2013/0196468 | A1 | 8/2013 | Yamazaki |
| 2013/0203214 | A1 | 8/2013 | Isobe et al. |
| 2015/0041803 | A1 | 2/2015 | Endo et al. |
| 2015/0221678 | A1 | 8/2015 | Yamazaki et al. |
| 2015/0263141 | A1 | 9/2015 | Yamazaki et al. |
| 2019/0326420 | A1 | 10/2019 | Yamazaki et al. |
| 2021/0013239 | A1 | 1/2021 | Yamazaki et al. |

FOREIGN PATENT DOCUMENTS

| | | | |
|---|---|---|---|
| DE | 102006026226 | | 7/2007 |
| DE | 102015201707 | | 8/2015 |
| GB | 2433821 | | 7/2007 |
| JP | 2007-180480 | A | 7/2007 |
| JP | 2013236126 | A * | 11/2013 |
| JP | 2014-007399 | A | 1/2014 |
| JP | 2015-053478 | A | 3/2015 |
| JP | 2015-179822 | A | 10/2015 |
| JP | 2015-188079 | A | 10/2015 |
| KR | 2007-0069337 | A | 7/2007 |
| KR | 2015-0017676 | A | 2/2015 |
| KR | 2015-0092722 | A | 8/2015 |
| TW | 201535690 | | 9/2015 |

OTHER PUBLICATIONS

Written Opinion (Application No. PCT/IB2019/059207) Dated Jan. 28, 2020.

* cited by examiner

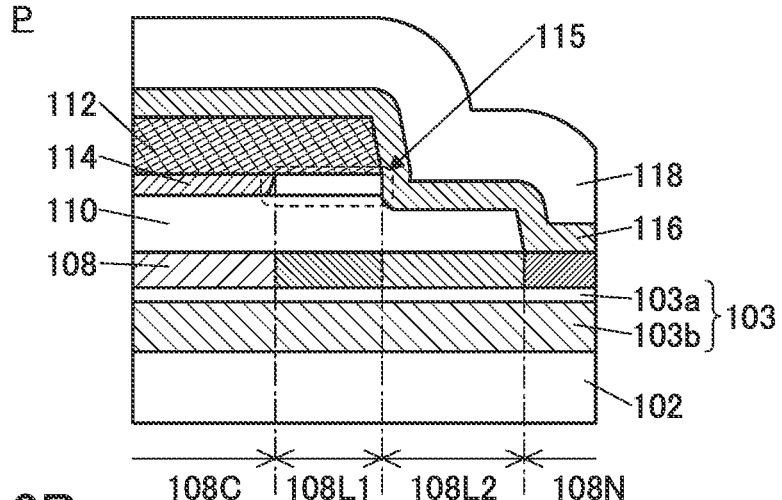
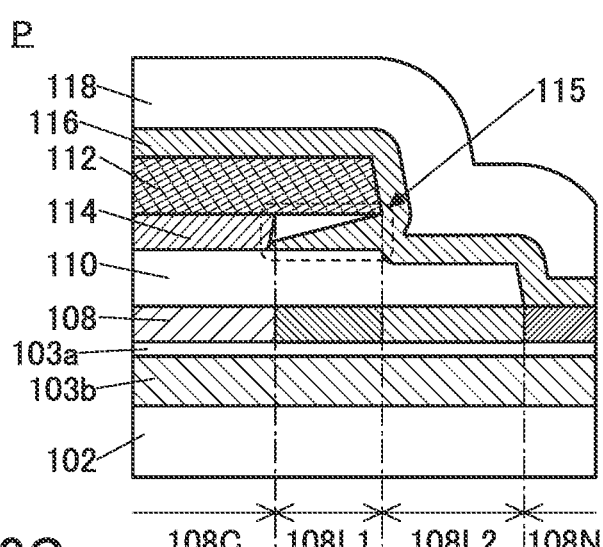
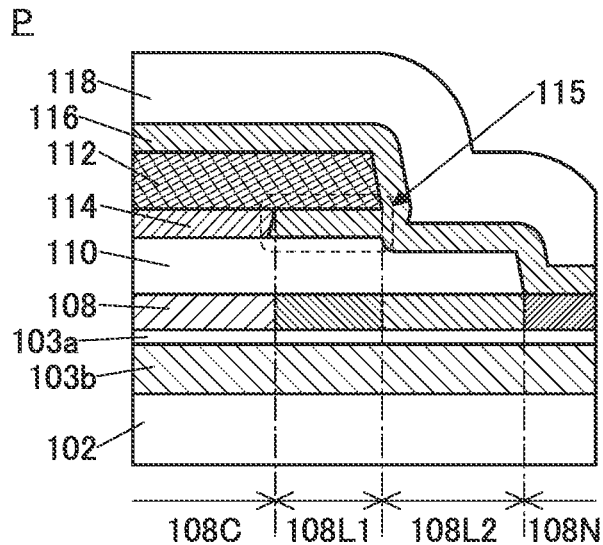

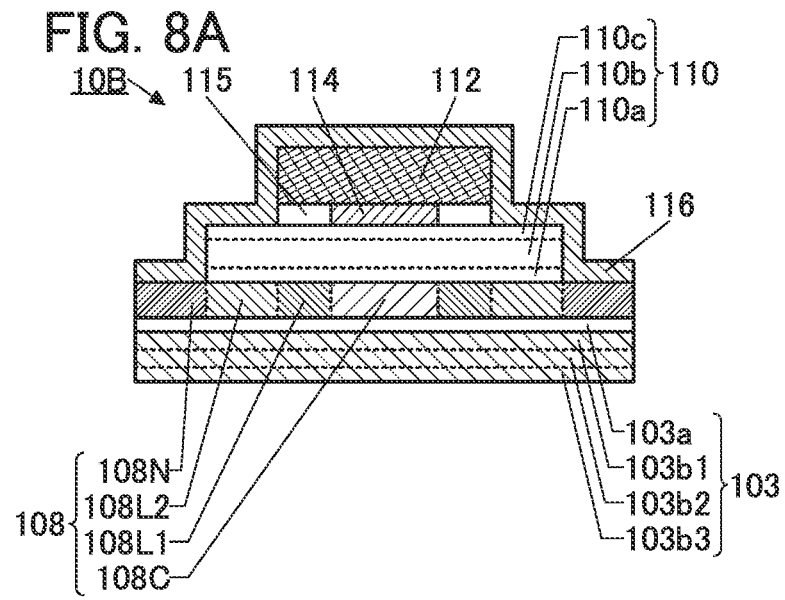
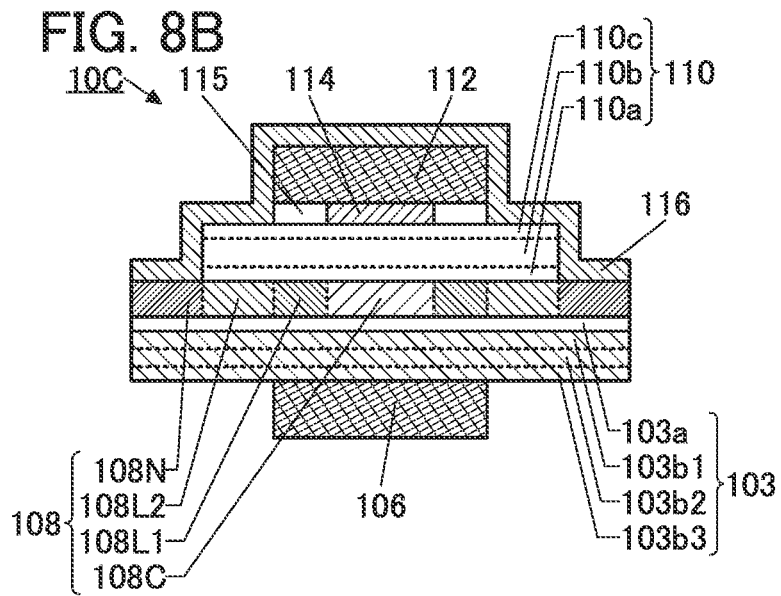

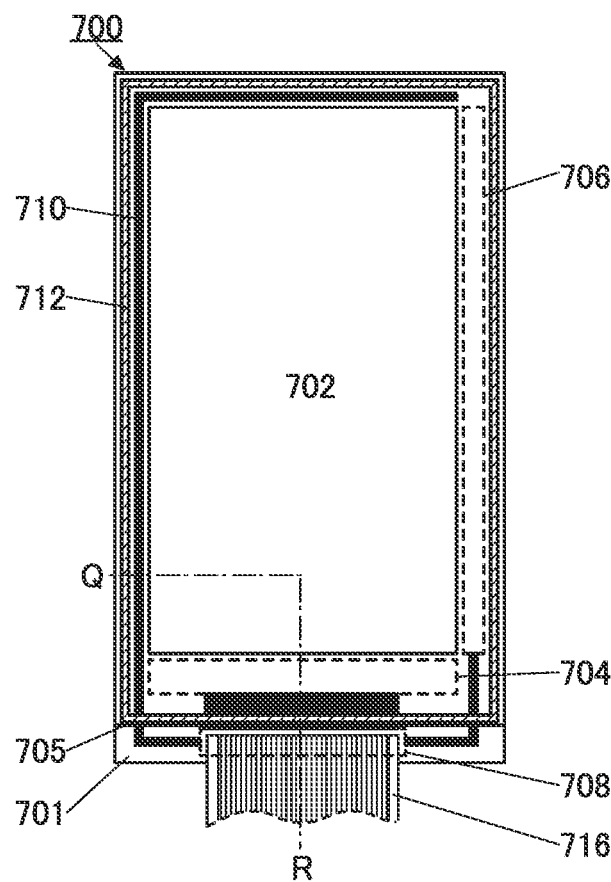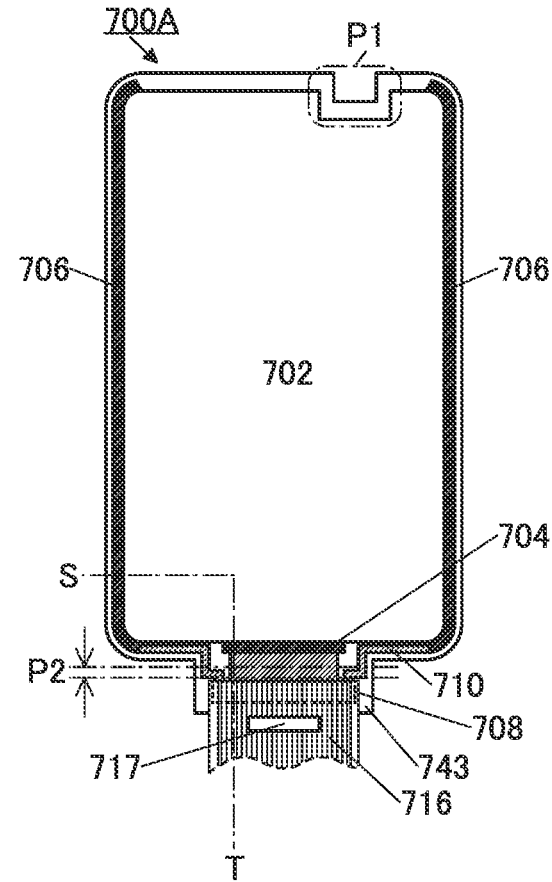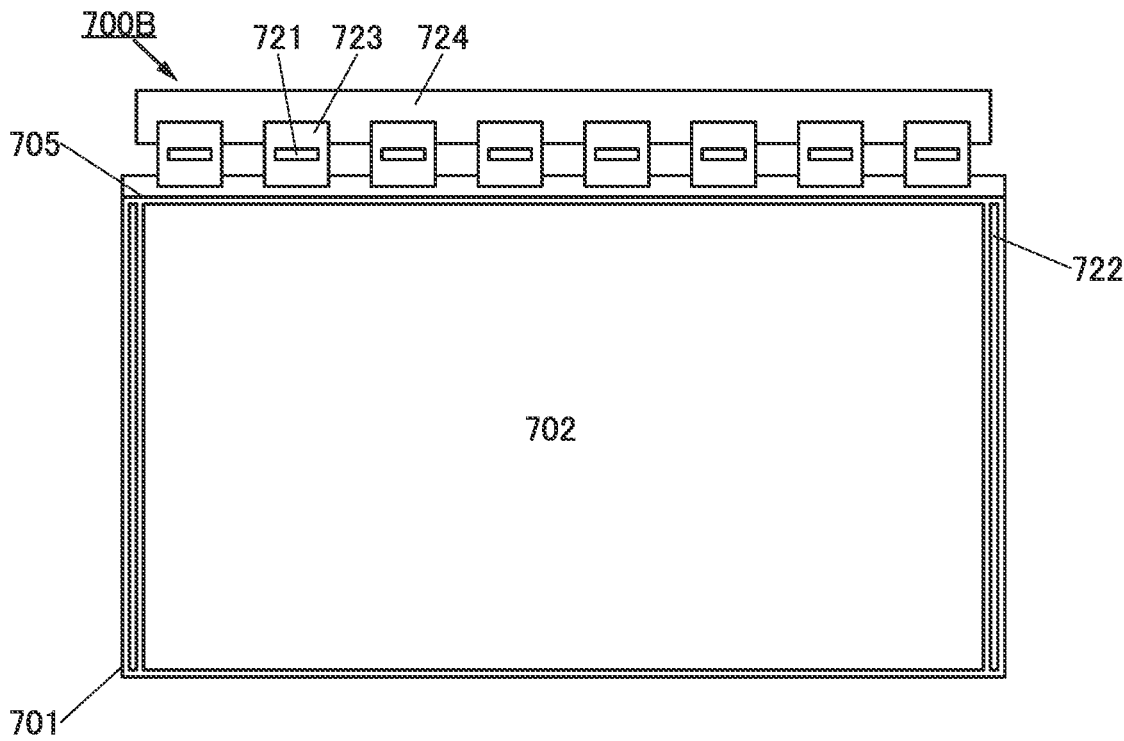

9100

9200

9101

9201

9102

9201

9201

SEMICONDUCTOR DEVICE

TECHNICAL FIELD

One embodiment of the present invention relates to a semiconductor device and a fabrication method thereof. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that makes field-effect mobility (simply referred to as mobility or FE in some cases) to be increased by stacking a plurality of oxide semiconductor layers, including indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; therefore, a high-performance display device provided with driver circuits can be achieved.

REFERENCE

Patent Document

[Patent Document 1] Japanese Published Patent Application No. 2014-7399

SUMMARY OF THE INVENTION

Problems to be Solved by the Invention

One object of one embodiment of the present invention is to provide a semiconductor device with favorable electrical characteristics. One object of one embodiment of the present invention is to provide a semiconductor device capable of high-voltage driving. One object of one embodiment of the present invention is to provide a semiconductor device in which a large amount of current can flow. One object of one embodiment of the present invention is to provide a semiconductor device with high reliability.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including a semiconductor layer; a first insulating layer, a second insulating layer; a metal oxide layer; a conductive layer; and an insulating region. The metal oxide layer is positioned between the first insulating layer and the conductive layer. The insulating region is adjacent to the metal oxide layer and is positioned between the first insulating layer and the conductive layer. The semiconductor layer includes a first region, a second region, a third region, and a fourth region. The first region is in contact with the first insulating layer and overlaps with the metal oxide layer and the conductive layer with the first insulating layer therebetween. The second region is in contact with the first insulating layer and overlaps with the insulating region and the conductive layer with the first insulating layer therebetween. The third region is in contact with the first insulating layer. The fourth region is in contact with the second insulating layer. The insulating region shows a different permittivity from the first insulating layer.

In the above, in a plan view, an end portion of the metal oxide layer is preferably positioned inward from an end portion of the conductive layer. In a plan view, the end portion of the conductive layer is preferably positioned inward from an end portion of the first insulating layer.

In the above, the first insulating layer, the metal oxide layer, and the conductive layer are preferably processed using the same resist mask.

In the above, the insulating region preferably includes a gap.

In the above, the insulating region preferably includes part of the second insulating layer. In that case, it is further preferable that the second insulating layer contain a nitride.

In the above, it is preferable that the first region have the lowest carrier concentration and the fourth region have the highest carrier concentration among the first region, the second region, the third region and the fourth region.

In the above, it is preferable that the first region have the lowest hydrogen concentration and the fourth region have the highest hydrogen concentration among the first region, the second region, the third region and the fourth region.

In the above, the semiconductor device preferably further includes a third insulating layer and a fourth insulating layer. In that case, it is preferable that the third insulating layer include a region that overlaps with the first insulating layer with the semiconductor layer therebetween, and the fourth insulating layer include a region that overlaps with the semiconductor layer with the third insulating layer therebetween. It is preferable that the third insulating layer contain an oxide, and the fourth insulating layer include a nitride.

In the above, it is preferable that the fourth insulating layer include a portion that is in contact with the second insulating layer in a region not overlapping with the semiconductor layer.

Effect of the Invention

According to one embodiment of the present invention, a semiconductor device with favorable electrical characteristics can be provided. Alternatively, a semiconductor device capable of high-voltage driving can be provided. Alternatively, a semiconductor device in which a large amount of current can flow can be provided. Alternatively, a semiconductor device with high reliability can be provided.

Note that the description of the effects does not preclude the existence of other effects. One embodiment of the present invention does not need to have all these effects. Effects other than these can be derived from the description of the specification, the drawings, the claims, and the like.

BRIEF DESCRIPTION OF THE DRAWINGS

FIG. 2A to FIG. 2C are diagrams illustrating structure examples of a semiconductor device.

FIG. 8A and FIG. 8B are diagrams illustrating structure examples of a semiconductor device.

FIG. 11A to FIG. 1C are top views of display devices.

MODE FOR CARRYING OUT THE INVENTION

Figure 1A:
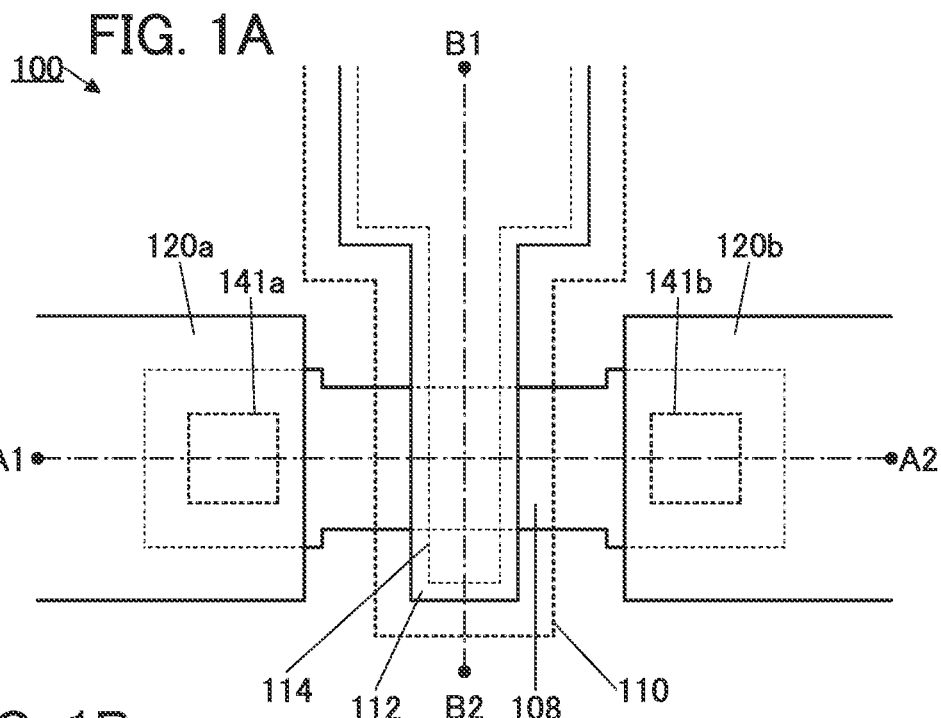
FIG. 1A to FIG. 1C are diagrams illustrating a structure example of a semiconductor device.

Hereinafter, embodiments are described with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

Furthermore, in each drawing described in this specification, the size, the layer thickness, or the region of each component is exaggerated for clarity in some cases.

Furthermore, ordinal numbers such as "first," "second," and "third" used in this specification are used in order to avoid confusion among components and do not limit the components numerically.

In addition, in this specification, terms for describing arrangement, such as "over" and "under," are used for convenience to describe the positional relationship between components with reference to drawings. The positional relation between components is changed as appropriate in accordance with a direction in which each component is described. Thus, terms for the description are not limited to those used in this specification, and the description can be rephrased appropriately depending on the situation.

Furthermore, in this specification and the like, functions of a source and a drain of a transistor are sometimes interchanged with each other when a transistor of opposite polarity is employed or the direction of current is changed in circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Each of the channel length direction and the channel width direction is not fixed to one direction in some cases depending on the structure and the shape of a transistor.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements having a variety of functions as well as an electrode and a wiring.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

Furthermore, unless otherwise specified, off-state current in this specification and the like refers to drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

In this specification and the like, a display panel which is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel which is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a semiconductor device of one embodiment of the present invention is described. Structure examples of a transistor which is an example of the semiconductor device and a fabrication method thereof are described below.

One embodiment of the present invention is a transistor including, over a formation surface, a semiconductor layer in which a channel is formed, a gate insulating layer (also referred to as a first insulating layer) over the semiconductor layer, and a conductive layer functioning as a gate electrode over the gate insulating layer. The semiconductor layer preferably includes a metal oxide exhibiting semiconductor characteristics (hereinafter also referred to as an oxide semiconductor).

One embodiment of the present invention includes a metal oxide layer between the first insulating layer and the conductive layer. The metal oxide layer preferably has conductivity, in which case the metal oxide layer functions as part of the gate electrode.

It is preferable that the first insulating layer, the conductive layer, and the metal oxide layer be processed so that parts of their respective end portions are positioned over the semiconductor layer. It is particularly preferable that the first insulating layer, the conductive layer, and the metal oxide layer be processed using the same resist mask.

It is preferable that the conductive layer be processed so that its end portion is positioned inward from the end portion of the first insulating layer. It is also preferable that the metal oxide layer be processed so that its end portion is positioned inward from the conductive layer. In other words, in a plan view, it is preferable that the conductive layer be provided inward from the end portion (outline) of the first insulating layer, and the metal oxide layer be provided inward from the end portion (outline) of the conductive layer.

One embodiment of the present invention includes an insulating region which is adjacent to and surrounds the metal oxide layer. The insulating region is a region interposed between the first insulating layer and the conductive layer and has an insulating property.

The semiconductor layer includes a first region in which a channel is formed, a pair of second regions which interposes the first region, a pair of third regions which interposes the first region and the second region, and a pair of fourth regions which interposes the first to the third region and functions as a source region and a drain region.

Here, the first region is a region that is in contact with the first insulating layer and overlaps with the metal oxide layer and the conductive layer. The second region is a region that is in contact with the first insulating layer and overlaps with the insulating region and the conductive layer. The third region is a region that is in contact with the first insulating layer and overlaps with neither of the conductive layer, the metal oxide layer, nor the insulating region. The fourth region is a region that is positioned outward from the end portion of the first insulating layer.

The fourth region is preferably in contact with the second insulating layer functioning as a protective layer. In that case, the second insulating layer preferably has a function of supplying carriers to the fourth region of the semiconductor layer at the time of deposition.

Among the four regions included in the semiconductor layer, the first region functioning as a channel formation region is a region with the lowest carrier concentration. The fourth region functioning as a source region and a drain region is a region with the highest carrier concentration. The second region and the third region can function as buffer regions for preventing carrier supply sources contained in the fourth region from diffusing into the first region, which is the channel formation region. When the second region and the third region are provided, the carrier concentration of the first region can be made extremely low. The second region and the third region may function as LDD (Lightly Doped Drain) regions.

The second region can also be referred to as an overlap region (an Lov-LDD region) because it is a region overlapping with the conductive layer functioning as a gate electrode with the insulating region interposed therebetween. On the other hand, the third region is a region not overlapping with the conductive layer, and thus can also be referred to as an offset region (Loff-LDD region).

The second region serving as the overlap region overlaps with the gate electrode with the insulating region interposed therebetween; hence, the electric field applied to the second region from the gate electrode can be relieved by the insulating region. Thus, a transistor with high reliability even when high-voltage driving is performed can be obtained.

The insulating region preferably shows a different permittivity from the first insulating layer. For example, the insulating region may be a region including a gap (space) or a region where part of the second insulating layer functioning as a protective layer is provided. The insulating region may also be a region where a gap and part of the second insulating layer are mixed. By providing such an insulating region, the electric field applied to the second region of the semiconductor layer from the gate electrode can be relieved effectively.

In the above manner, in one embodiment of the present invention, the overlap region and the offset region are provided between the channel formation region and each of the source region and the drain region in the semiconductor layer; hence, a transistor with high reliability in which a large amount of current can be made to flow by a high voltage application can be achieved.

More specific examples are described below with reference to drawings.

Structure Example 1

Figure 1B:
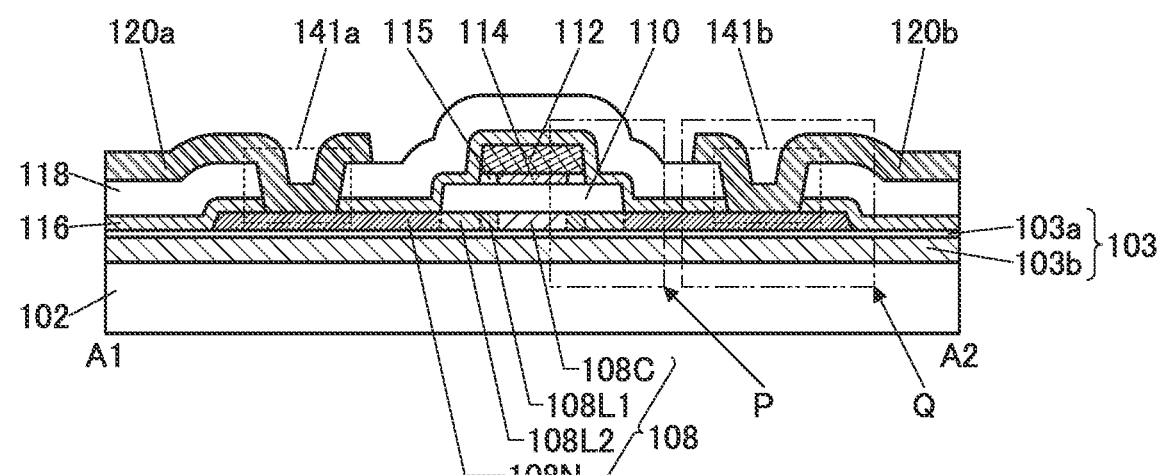

FIG. 1A is a top view of a transistor 100, FIG. 1B corresponds to a cross-sectional view of a cut plane along the dashed-dotted line A1-A2 shown in FIG. 1A, and FIG.

1C corresponds to a cross-sectional view of a cut plane along the dashed-dotted line B1-B2 shown in FIG. 1A. Note that in FIG. 1A, some components of the transistor 100 (a protective insulating layer and the like) are not illustrated. The direction of the dashed-dotted line A1-A2 corresponds to a channel length direction, and the direction of the dashed-dotted line B1-B2 corresponds to a channel width direction. Some components are not illustrated in top views of transistors in the following drawings, as in FIG. 1A.

The transistor 100 is provided over a substrate 102 and includes an insulating layer 103, a semiconductor layer 108, an insulating layer 110, a metal oxide layer 114, a conductive layer 112, an insulating layer 116, an insulating layer 118, and the like. The semiconductor layer 108 having an island shape is provided over the insulating layer 103. The insulating layer 110 is provided to cover part of a top surface of the insulating layer 103 and part of a top surface of the semiconductor layer 108. The metal oxide layer 114 and the conductive layer 112 are provided to be stacked in this order over the insulating layer 110 and each include a portion overlapping with the semiconductor layer 108. The insulating layer 116 is provided to cover the top surface and a side surface of the conductive layer 112, the top surface and a side surface of the insulating layer 110, the top surface and a side surface of the semiconductor layer 108, and the top surface of the insulating layer 103. The insulating layer 118 is provided to cover the insulating layer 116.

In FIG. 1A, the outlines of the metal oxide layer 114 and the insulating layer 110 are indicated by dashed lines. The metal oxide layer 114 and the conductive layer 112 are provided to be positioned inward from an end portion of the insulating layer 110 in a plan view. The metal oxide layer 114 is provided to be positioned inward from an end portion of the conductive layer 112 in a plan view. Here, it is preferable that the conductive layer 112, the metal oxide layer 114, and the insulating layer 110 be processed using the same resist mask.

Part of the conductive layer 112 functions as a gate electrode. Part of the insulating layer 110 functions as a gate insulating layer. The transistor 100 is what is called a top-gate transistor, in which the gate electrode is provided over the semiconductor layer 108.

The insulating layer 103 preferably has a stacked-layer structure in which an insulating film 103b and an insulating film 103a are stacked from the substrate 102 side. Here, the insulating film 103b positioned on the substrate 102 side preferably functions as a barrier film that prevents diffusion of impurities contained in the substrate 102. In contrast, the insulating film 103a in contact with the semiconductor layer 108 preferably contains an oxide.

As a more specific example, the insulating film 103a preferably contains an oxide such as silicon oxide or silicon oxynitride. In contrast, the insulating film 103b preferably contains a nitride such as silicon nitride, silicon nitride oxide, aluminum oxynitride, or aluminum nitride. Alternatively, the insulating film 103b may contain a metal oxide such as aluminum oxide, hafnium oxide, or hafnium aluminate.

As illustrated in FIG. 1A and FIG. 1B, the transistor 100 may include a conductive layer 120a and a conductive layer 120b over the insulating layer 118. The conductive layer 120a and the conductive layer 120b function as a source electrode and a drain electrode. The conductive layer 120a and the conductive layer 120b are electrically connected to a region 108N in the semiconductor layer 108 respectively through an opening 141a and an opening 141b which are provided in the insulating layer 118 and the insulating layer 116.

The metal oxide layer 114 positioned between the insulating layer 110 and the conductive layer 112 functions as a barrier film that prevents diffusion of oxygen contained in the insulating layer 110 to the conductive layer 112 side. Furthermore, the metal oxide layer 114 also functions as a barrier film that prevents diffusion of hydrogen and water contained in the conductive layer 112 to the insulating layer 110 side. The metal oxide layer 114 is preferably formed using, for example, a material that is less likely to transmit oxygen and hydrogen than at least the gate insulating layer 110.

Even in the case where a metal material that is likely to absorb oxygen, such as aluminum or copper, is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier concentration of a channel formation region of the semiconductor layer 108 can be extremely low.

The metal oxide layer 114 has a function of supplying oxygen to the insulating layer 110. In the case where a conductive film containing a metal or an alloy that is easily oxidized is used for the conductive layer 112, the metal oxide layer 114 can also function as a barrier layer that prevents the conductive layer 112 from being oxidized by oxygen in the insulating layer 110.

For the metal oxide layer 114, an insulating material or a conductive material can be used. When the metal oxide layer 114 has an insulating property, the metal oxide layer 114 functions as part of the gate insulating layer. In contrast, when the metal oxide layer 114 has conductivity, the metal oxide layer 114 functions as part of the gate electrode. In particular, in one embodiment of the present invention, the metal oxide layer 114 preferably has conductivity and functions as part of the gate electrode.

For the metal oxide layer 114, a conductive oxide such as indium oxide, indium tin oxide (ITO), indium tin oxide containing silicon (ITSO), or indium zinc oxide can also be used, for example. A conductive oxide containing indium is particularly preferable because of its high conductivity.

For the metal oxide layer 114, an oxide material containing one or more elements that are the same as those of the semiconductor layer 108 is preferably used. It is particularly preferable to use an oxide semiconductor material that can be used for the semiconductor layer 108. Here, a metal oxide film formed using the same sputtering target as the semiconductor layer 108 is preferably used for the metal oxide layer 114 because an apparatus can be shared.

In addition, the metal oxide layer 114 is preferably formed using a sputtering apparatus. For example, in the case where an oxide film is formed using a sputtering apparatus, forming the oxide film in an atmosphere containing an oxygen gas can suitably supply oxygen into the insulating layer 110 or the semiconductor layer 108.

Note that, in the case where an insulating material is used for the metal oxide layer 114, an insulating material with a higher permittivity than silicon oxide is preferably used. It is particularly preferable to use an aluminum oxide film, a hafnium oxide film, a hafnium aluminate film, or the like because drive voltage can be reduced.

The semiconductor layer 108 includes a metal oxide showing semiconductor characteristics (hereinafter also referred to as an oxide semiconductor). The semiconductor layer 108 preferably contains at least indium and oxygen. The semiconductor layer 108 containing an oxide of indium can have higher carrier mobility, which can achieve a transistor in which a larger amount of current can flow than in a transistor using, for example, amorphous silicon.

As illustrated in FIG. 1B, the semiconductor layer 108 includes a region 108C functioning as the channel formation region, a pair of regions 108L1 which interposes the region 108C, a pair of regions 108L2 which interposes the region 108C and a region L1, a pair of regions 108N which interposes the region 108C, the region 108L1, and the region 108L2 and functions as the source region and the drain region.

The top surfaces of each of the region 108C, the region 108L1, and the region 108L2 are in contact with the insulating layer 110. The region 108C is a region overlapping with the insulating layer 110, the metal oxide layer 114, and the conductive layer 112. The region 108L1 is a region overlapping with the insulating layer 110, an insulating region 115, and the conductive layer 112. The region 108L2 is a region overlapping with the insulating layer 110 and not overlapping with the conductive layer 112.

The region 108C functions as a channel formation region. Here, the metal oxide layer 114 functions as part of a gate electrode when including a conductive layer; thus, an electric field is applied from the gate electrode to the region 108C through the insulating layer 110 functioning as a gate insulating layer, whereby a channel is formed.

The region 108L1 has a function of a buffer region that relieves a drain electric field. Here, the region 108L1 overlaps with the conductive layer 112, and thus is a region in which a channel might be formed in the case where a gate voltage is applied to the conductive layer 112. However, since the region 108L1 overlaps with the conductive layer 112 with the insulating region 115 therebetween, the electric field applied to the region 108L1 is weaker than the electric field applied to the region 108C. As a result, the region 108L1 is a region having higher resistance than the region 108C and functioning as an LDD region for relieving a drain electric field. Furthermore, even when the carrier concentration of the region 108L1 is extremely low and is substantially the same as that of the region 108C, the region 108L1 can function as an LDD region since a channel can be formed due to the electric field of the conductive layer 112.

The region 108L2 has a function of a buffer region for relieving a drain electric field like the region 108L1. The region 108L2 is a region not overlapping with the conductive layer 112 and the metal oxide layer 114, and thus is a region in which a channel is hardly formed even when a gate voltage is applied to the conductive layer 112. The region 108L2 preferably has a higher carrier concentration than the region 108C. In that case, the region 108L2 can function as an LDD region.

In this manner, by providing the region 108L1 and the region 108L2 that function as LDD regions between the region 108C that is the channel formation region and the region 108N that is the source region or the drain region, a transistor with high reliability having both a high drain withstand voltage and a high on-state current can be achieved.

The region 108N is a region functioning as the source region or the drain region and having lower resistance than any of the other regions of the semiconductor layer 108. Alternatively, the region 108N can be regarded as a region having a higher carrier concentration, a region having a higher oxygen defect density and a region having a higher impurity concentration than any of the other regions of the semiconductor layer 108.

The electric resistance of the region 108N is preferably as low as possible; for example, the sheet resistance of the region 108N is preferably higher than or equal to 1 Ω/square and lower than $1 \times 10^3$ Ω/square, further preferably higher than or equal to 1 Ω/square and lower than or equal to $8 \times 10^2$ Ω/square. The electric resistance in the region 108C in a state where a channel is not formed is preferably as high as possible; for example, the sheet resistance of the region 108C is preferably higher than or equal to $1 \times 10^9$ Ω/square, further preferably higher than or equal to $5 \times 10^9$ Ω/square, still further preferably higher than or equal to $1 \times 10^{10}$ Ω/square.

The sheet resistance of the region 108L2 can be, for example, higher than or equal to $1 \times 10^3$ Ω/square and lower than or equal to $1 \times 10^9$ Ω/square, preferably higher than or equal to $1 \times 10^3$ Ω/square and lower than or equal to $1 \times 10^8$ Ω/square, further preferably higher than or equal to $1 \times 10^3$ Ω/square and $1 \times 10^7$ Ω/square. When the resistance is within the above range, a transistor with favorable electrical characteristics and high reliability can be achieved. Note that the sheet resistance can be calculated from a resistance value. Providing the region 108L2 between the region 108N and the region 108C can increase the source-drain withstand voltage of the transistor 100.

The sheet resistance of the region 108L1 is preferably equivalent to that of the region 108C. Alternatively, the sheet resistance of the region 108L1 is preferably lower than the sheet resistance of the region 108C and higher than the sheet resistance of the region 108L2.

The semiconductor layer 108 preferably has a distribution of the carrier concentration that is the lowest in the region 108C and higher in the order of the region 108L1, the region 108L2, and the region 108N. When the region 108L1 and the region 108L2 are provided between the region 108C and the region 108N, the carrier concentration of the region 108C can be kept extremely low even when impurities such as hydrogen diffuse from the region 108N during the fabrication process.

The carrier concentration of the region 108C functioning as a channel formation region is preferably as low as possible, and is preferably lower than or equal to $1 \times 10^{18}$ cm$^{-3}$, further preferably lower than or equal to $1 \times 10^{17}$ cm$^{-3}$, still further preferably lower than or equal to $1 \times 10^{16}$ cm$^{-3}$, yet further preferably lower than or equal to $1 \times 10^{-3}$ cm$^{-3}$, and yet still further preferably lower than or equal to $1 \times 10^{12}$ cm$^{-3}$. Note that the lower limit of the carrier concentration of the region 108C is not particularly limited and can be, for example, $1 \times 10^{-9}$ cm$^{-3}$.

Meanwhile, the carrier concentration of the region 108N can be higher than or equal to $5 \times 10^{18}$ cm$^{-3}$, preferably higher than or equal to $1 \times 10^{19}$ cm$^{-3}$, further preferably higher than or equal to $5 \times 10^{-19}$ cm$^{-3}$, for example. The upper limit of the carrier concentration of the region 108N is not particularly limited and can be, for example, $5 \times 10^{21}$ cm$^{-3}$ or $1 \times 10^{22}$ cm$^{-3}$.

The carrier concentration of the region 108L2 can be a value between that of the region 108C and that of the region 108N. For example, the carrier concentration of the region 108L2 can be a value in the range of higher than or equal to $1 \times 10^{14}$ cm$^{-3}$ and lower than $1 \times 10^{20}$ cm$^{-3}$. The carrier concentration of the region 108L1 can be equivalent to that of the region 108C, or can be higher than that of the region 108C and lower than that of the region 108L2.

In the semiconductor layer 108, it is preferable that the region 108C be the region with the lowest hydrogen concentration and the region 108N be the region with the highest hydrogen concentration. The semiconductor layer 108 preferably has a distribution of the hydrogen concentration that is the lowest in the region 108C and higher in the order of the region 108L1, the region 108L2, and the region 108N.

The width of the region 108L1 can be adjusted as appropriate depending on the channel length (the width of the region 108C in the channel length direction), a voltage applied to the gate electrode and between the source and the drain of the transistor 100, or the like. As the channel length is shorter, the drain withstand voltage is decreased; thus, the ratio of the width of the region 108L1 to the channel length is preferably high. For example, the width of the region 108L1 can be greater than or equal to 5 nm and less than or equal to 10 μm, preferably greater than or equal to 10 nm and less than or equal to 5 μm, further preferably greater than or equal to 20 nm and less than or equal to 3 μm.

Similarly, the width of the region 108L2 can be adjusted as appropriate depending on the channel length, a voltage applied to the gate electrode and between the source and the drain of the transistor 100, or the like. For example, the width of the region 108L2 can be greater than or equal to 5 nm and less than or equal to 10 μm, preferably greater than or equal to 10 nm and less than or equal to 5 μm, further preferably greater than or equal to 20 nm and less than or equal to 3 μm.

The insulating layer 116 is provided in contact with the top surface of the region 108N. The insulating layer 116 has a function of reducing the resistance of the region 108N. The insulating layer 116 can be formed using an insulating film which can supply impurities to the region 108N by being heated at the time of or after the deposition of the insulating layer 116. Alternatively, an insulating film which can generate oxygen vacancies in the region 108N by being heated at the time of or after the deposition of the insulating layer 116 can be used.

For example, as the insulating layer 116, an insulating film functioning as a supply source that supplies impurities to the region 108N can be used. In that case, the insulating layer 116 is preferably a film from which hydrogen is released by heating. When such an insulating layer 116 is formed in contact with the semiconductor layer 108, impurities such as hydrogen can be supplied to the region 108N, so that the resistance of the region 108N can be reduced.

The insulating layer 116 is preferably a film deposited using a gas containing an impurity element such as a hydrogen element as a deposition gas used for the deposition. In addition, by increasing the deposition temperature of the insulating layer 116, a large number of impurity elements can be effectively supplied to the semiconductor layer 108. The deposition temperature of the insulating layer 116 is higher than or equal to 200° C. and lower than or equal to 500° C., preferably higher than or equal to 220° C. and lower than or equal to 450° C., further preferably higher than or equal to 250° C. and lower than or equal to 400° C., for example.

When the insulating layer 116 is deposited under a reduced pressure while heating is performed, release of oxygen from the region to be the region 108N of the semiconductor layer 108 can be promoted. When impurities such as hydrogen is supplied to the semiconductor layer 108 where many oxygen vacancies are formed, the carrier concentration of the region 108N is increased and the resistance of the region 108N can be reduced more effectively.

For the insulating layer 116, for example, an insulating film containing a nitride such as silicon nitride, silicon nitride oxide, silicon oxynitride, aluminum nitride, or aluminum nitride oxide can be used favorably. In particular, silicon nitride has a blocking property against hydrogen and oxygen, and thus can prevent both diffusion of hydrogen from the outside into the semiconductor layer and release of oxygen from the semiconductor layer to the outside, leading to a transistor with high reliability.

The insulating layer 116 may be an insulating film having a function of absorbing oxygen in the semiconductor layer 108 and generating oxygen vacancies. It is particularly preferable to use a metal nitride such as aluminum nitride for the insulating layer 116.

In the case of using a metal nitride, it is preferable to use a nitride of aluminum, titanium, tantalum, tungsten, chromium, or ruthenium. In particular, aluminum or titanium is preferably contained. For example, an aluminum nitride film formed by a reactive sputtering method using aluminum as a sputtering target and a nitrogen-containing gas as a deposition gas can be a film having both an extremely high insulating property and an extremely high blocking property against hydrogen and oxygen when the ratio of the flow rate of a nitrogen gas to the total flow rate of the deposition gas is appropriately controlled. Thus, when such an insulating film containing a metal nitride is provided in contact with the semiconductor layer 108, the resistance of the semiconductor layer 108 can be reduced, and release of oxygen from the semiconductor layer 108 and diffusion of hydrogen into the semiconductor layer 108 can be favorably prevented.

In the case of using aluminum nitride as the metal nitride, the thickness of the insulating layer containing aluminum nitride is preferably 5 nm or more. A film with such a small thickness can have both a high blocking property against hydrogen and oxygen and a function of reducing the resistance of the semiconductor layer. Note that there is no upper limit of the thickness of the insulating layer; however, the thickness is preferably less than or equal to 500 nm, further preferably less than or equal to 200 nm, still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation property of heat generated in driving the transistor 100 can be increased.

Alternatively, an aluminum titanium nitride film, a titanium nitride film, or the like can be used as the insulating layer 116.

Such an insulating layer 116 is provided in contact with the region 108N, whereby the insulating layer 116 absorbs oxygen in the region 108N and oxygen vacancies can be formed in the region 108N. Furthermore, when heat treatment is performed after the insulating layer 116 is formed, a larger number of oxygen vacancies can be formed in the region 108N, so that the reduction of resistance can be promoted. In the case where a film including a metal oxide is used as the insulating layer 116, a layer including an oxide of a metal element (e.g., aluminum) included in the insulating layer 116 is sometimes formed between the insulating layer 116 and the region 108N as a result of absorption of oxygen in the semiconductor layer 108 by the insulating layer 116.

Here, in the case where a metal oxide film containing indium is used as the semiconductor layer 108, a region where indium oxide is precipitated or a region having a high indium concentration is sometimes formed in the region 108N in the vicinity of the interface with the insulating layer 116. Accordingly, the region 108N with an extremely low resistance can be formed. The existence of such a region can be observed by an analysis method such as an X-ray photoelectron spectroscopy (XPS) in some cases, for example.

The insulating layer 118 functions as a protective layer protecting the transistor 100. For example, an inorganic insulating material such as an oxide or a nitride can be used for the insulating layer 110. As a more specific example, an inorganic insulating material such as silicon oxide, silicon oxynitride, silicon nitride, silicon nitride oxide, aluminum oxide, aluminum oxynitride, aluminum nitride, hafnium oxide, or hafnium aluminate can be used.

Here, the composition of the semiconductor layer 108 is described. The semiconductor layer 108 preferably contains a metal oxide containing at least indium and oxygen. The semiconductor layer 108 may contain zinc in addition to them. The semiconductor layer 108 may contain gallium.

The semiconductor layer 108 preferably contains indium, M (M is one kind or a plurality of kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one kind or a plurality of kinds selected from aluminum, gallium, yttrium, and tin.

Typically, an indium oxide, an indium zinc oxide (In—Zn oxide), an indium gallium zinc oxide (also denoted as In—Ga—Zn oxide or IGZO), or the like can be used for the semiconductor layer 108. Alternatively, an indium tin oxide (In—Sn oxide), an indium tin oxide containing silicon, or the like can be used. It is particularly preferable to use an oxide containing indium, gallium, and zinc for the semiconductor layer 108.

The semiconductor layer 108 may have a stacked-layer structure in which layers with different compositions, layers with different crystallinities, or layers with different impurity concentrations are stacked.

Here, the composition and crystallinity of the semiconductor layer 108 greatly affect the electrical characteristics and reliability of the transistor 100. For example, an increase in the indium content in the semiconductor layer 108 can increase the carrier mobility and achieve a transistor with high field-effect mobility.

It is preferable to use a metal oxide film having crystallinity as the semiconductor layer 108. For example, a metal oxide film having a CAAC (c-axis aligned crystal) structure, which is described later, a polycrystalline structure, a microcrystalline structure, or the like can be used. By using a metal oxide film having crystallinity as the semiconductor layer 108, the density of defect states in the semiconductor layer 108 can be reduced, whereby a semiconductor device with high reliability can be achieved.

As the semiconductor layer 108 has higher crystallinity, the density of defect states in the film can be lower. In contrast, by using a metal oxide film with low crystallinity, a transistor in which a large amount of current can flow can be achieved.

In the case where the metal oxide film is deposited by a sputtering method, the crystallinity of the deposited metal oxide film can be increased as the substrate temperature (the stage temperature) at the time of deposition is higher. The crystallinity of the deposited metal oxide film can be increased as the proportion of a flow rate of an oxygen gas to the whole deposition gas (also referred to as oxygen flow rate ratio) used at the time of deposition is higher.

FIG. 2A is an enlarged view of a region P in FIG. 1B.

FIG. 2A illustrates an example in which the insulating region 115 includes a gap (space). Here, the insulating region 115 may be in a vacuum or under a reduced pressure, or may be filled with gas. Air is a typical example of gas contained in the insulating region 115; however, an inert gas such as nitrogen or a rare gas, a deposition gas used at the time of deposition of the insulating layer 116 or the insulating layer 118, or the like may be contained in the insulating region 115.

As for the insulating region 115 including a gap illustrated in FIG. 2A, the insulating region 115 illustrated in FIG. 2A can be formed using, for example, a method providing relatively low step coverage as the deposition method of the insulating layer 116, which does not form the insulating layer 116 below the protruding portion of the conductive layer 112.

FIG. 2B illustrates an example in which the insulating region 115 includes part of the insulating layer 116 and a gap. The insulating region 115 illustrated in FIG. 2B can be formed using, for example, a method providing relatively high step coverage as the deposition method of the insulating layer 116, which forms part of the insulating layer 116 below the protruding portion of the conductive layer 112.

FIG. 2C illustrates an example in which the insulating region 115 is filled with part of the insulating layer 116. The insulating region 115 illustrated in FIG. 2C can be formed using, for example, a method providing extremely high step coverage as the deposition method of the insulating layer 116, which forms part of the insulating layer 116 to fill a region below the protruding portion of the conductive layer 112.

Here, the insulating region 115 functions as part of a gate insulating layer for the region 108L1. In other words, the transistor 100 can be regarded as a transistor in which a first channel formation region (i.e., the region 108C) with the insulating layer 110 as the gate insulating layer thereover and a second channel formation layer (i.e., the region 108L1) with a stacked layer structure of the insulating layer 110 and the insulating region 115 as the gate insulating layer thereover are connected in series. In other words, the region 108L1 can be referred to as the second channel formation region over which a gate insulating layer thicker than that of the first channel formation region is provided.

For example, in the structure illustrated in FIG. 2A and FIG. 2B, the insulating region 115 includes a gap; thus, the insulating region 115 shows a different permittivity from the insulating layer 110. In the case where the insulating region 115 is filled with part of the insulating layer 116 as illustrated in FIG. 2C and an insulating film formed using different material or different condition from the insulating layer 110 is used for the insulating layer 116, the permittivity of the insulating region 115 can be different from that of the insulating layer 110.

In this manner, it is preferable that the insulating region 115 shows a different permittivity from the insulating layer 110. In the case where the insulating region 115 shows a higher permittivity than the insulating layer 110, the electric field applied to the region 108L1 from the conductive layer 112 is stronger and the resistance of the region 108L1 is likely to be low compared to the case where the insulating region 115 and the insulating layer 110 show the same permittivity, so that a larger amount of current can flow in the transistor 100. On the other hand, in the case where the insulating region 115 shows a lower permittivity than the insulating layer 110, the electric field is weaker and the reduction in the resistance of the region 108L1 is further inhibited compared to the case where the insulating region 115 and the insulating layer 110 show the same permittivity, so that the drain withstand voltage of the transistor 100 can be increased.

Figure 3A:
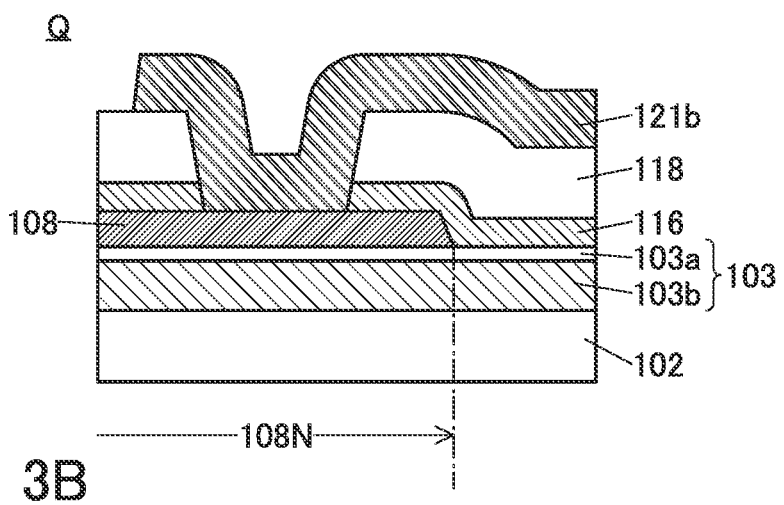
FIG. 3A and FIG. 3B are diagrams illustrating structure examples of a semiconductor device.

FIG. 3A shows an enlarged view of a region Q in FIG. 1B. As illustrated in FIG. 3A, the insulating layer 116 is provided to cover the top surface and the side surface of the semiconductor layer 108 in the region 108N. The insulating layer 116 includes a portion that is in contact with the insulating film 103a of the insulating layer 103 in a region where the semiconductor layer 108 is not provided.

Figure 1C:
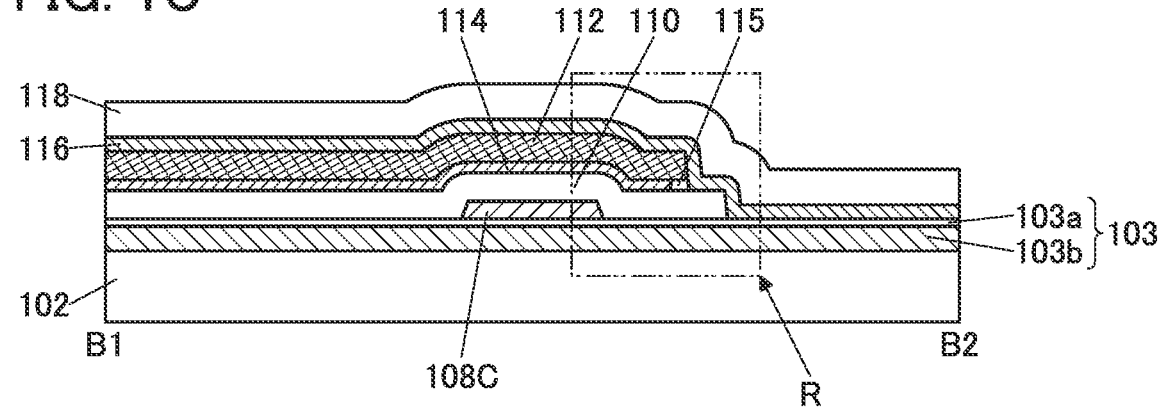
Figure 3B:
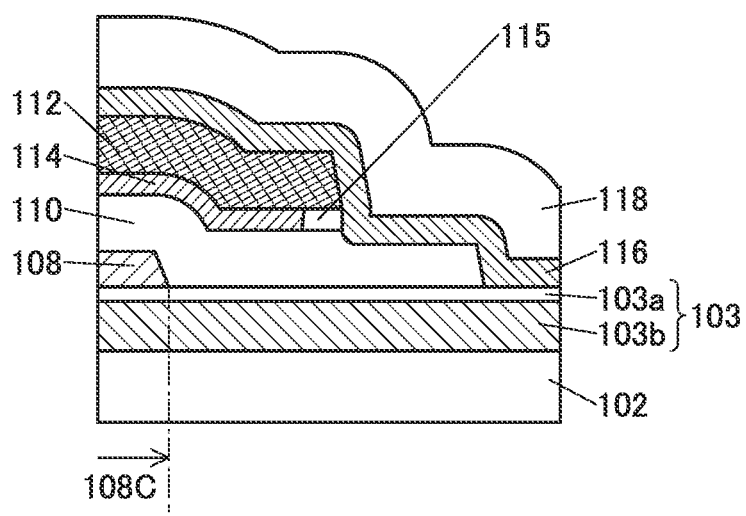

FIG. 3B shows an enlarged view of a region R in FIG. 1C. As illustrated in FIG. 3B, the insulating region 115 is formed between the conductive layer 112 and the insulating layer 110 also in the channel width direction of the transistor 100. In other words, the insulating region 115 is provided to surround the metal oxide layer 114 along the outline (side surface) of the metal oxide layer 114. It can also be said that the metal oxide layer 114 is provided in a region surrounded by the insulating layer 110, the conductive layer 112, and the insulating region 115.

As illustrated in FIG. 2A to FIG. 2C and FIG. 3B, the thickness of the insulating layer 110 is thinner in a region not overlapping with the conductive layer 112 than in a region overlapping with the conductive layer 112, in some cases. For example, part of the insulating layer 110 being simultaneously etched at the time of etching for forming the conductive layer 112 might lead to such a shape. Note that the insulating layer 110 might not be thinned depending on the processing conditions of the conductive layer 112 and the metal oxide layer 114.

Modification Example

Figure 4A:
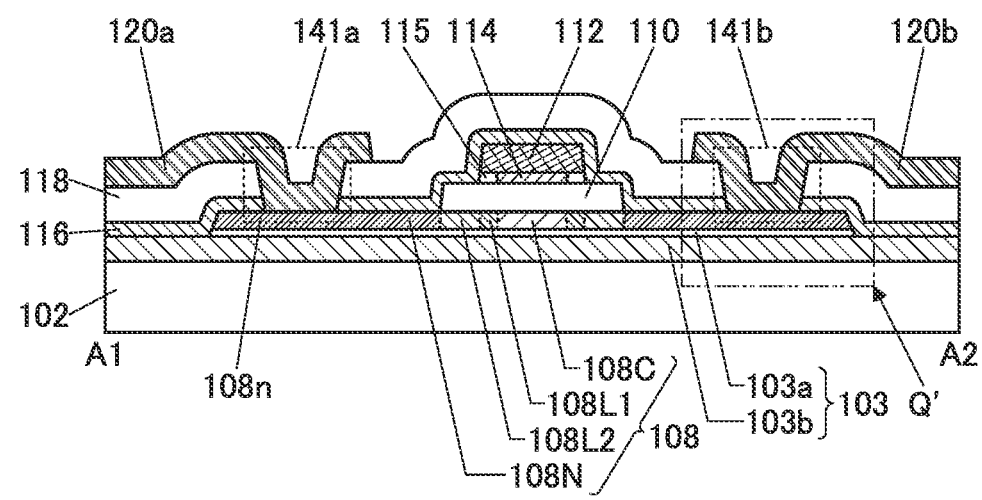
FIG. 4A and FIG. 4B are diagrams illustrating a structure example of a semiconductor device.
Figure 4B:
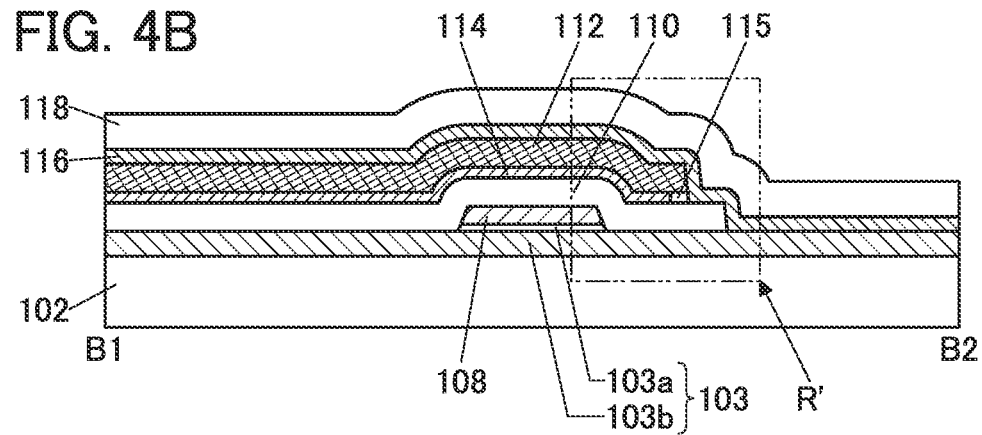

FIG. 4A and FIG. 4B are cross-sectional views of a transistor partly different from that in Structure Example 1. Note that FIG. 1A can be referred to for the top view.

Figure 5A:
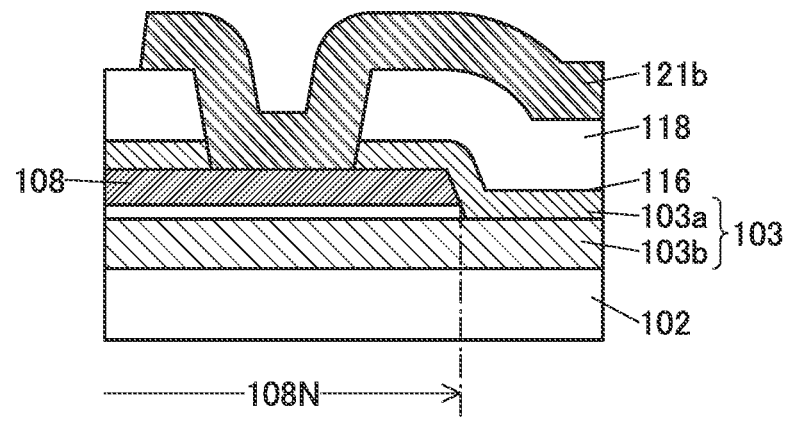
FIG. 5A and FIG. 5B are diagrams illustrating structure examples of a semiconductor device.
Figure 5B:
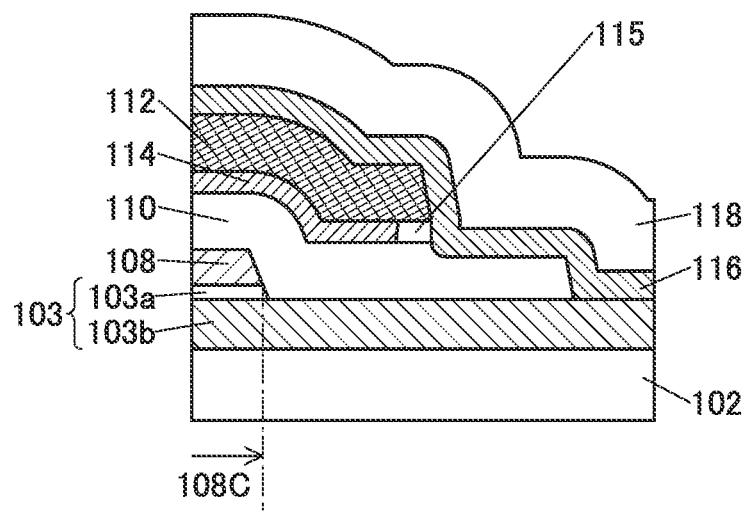

FIG. 5A illustrates an enlarged view of a region Q' in FIG. 4A and FIG. 5B illustrates an enlarged view of a region R' in FIG. 4B.

The transistor exemplified here is different from that in Structure Example 1 mainly in that the insulating film 103a included in the insulating layer 103 is processed to have substantially the same top surface shape as the semiconductor layer 108.

Furthermore, the insulating layer 116 and the insulating film 103b are provided to be in contact with each other in a region where the semiconductor layer 108 is not provided. Thus, the periphery of the transistor can be sealed by the insulating layer 116 and the insulating film 103b. Thus, a structure where impurities such as water or hydrogen are less likely to enter from the outside can be achieved, whereby a transistor with high reliability can be achieved.

Structure Example 2

A structure example of a transistor whose structure is partly different from that of the above structure example is described below. Note that description of the same portions as those in Structure Example 1 is omitted below in some cases. Furthermore, in drawings that are referred to later, the same hatching pattern is applied to portions having functions similar to those in the above structure example, and the portions are not denoted by reference numerals in some cases.

Figure 6A:
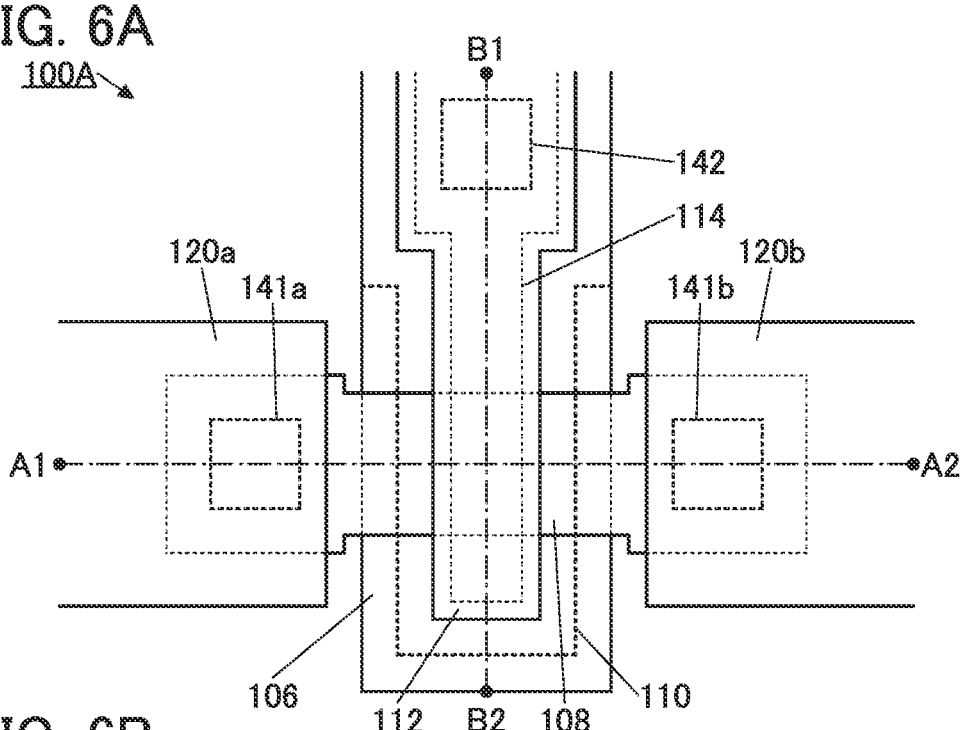
FIG. 6A to FIG. 6C are diagrams illustrating a structure example of a semiconductor device.
Figure 6B:
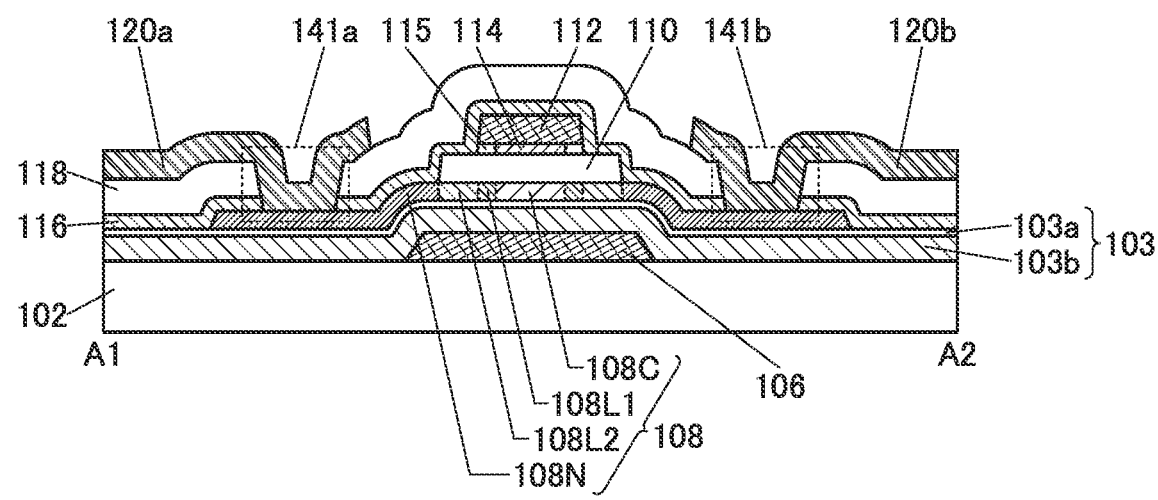
Figure 6C:
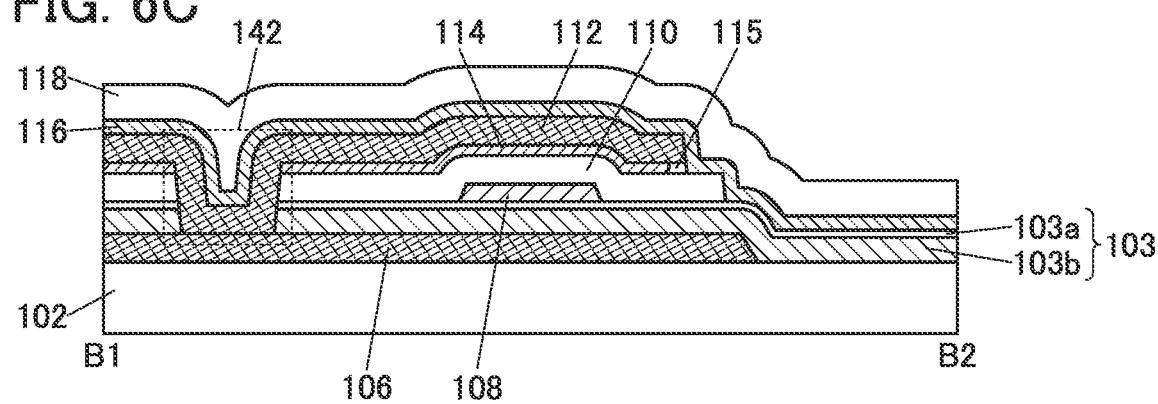

FIG. 6A is a top view of a transistor 100A, FIG. 6B is a cross-sectional view of the transistor 100A in the channel length direction, and FIG. 6C is a cross-sectional view of the transistor 100A in the channel width direction.

The transistor 100A is different from Structure Example 1 mainly in including a conductive layer 106 between the substrate 102 and the insulating layer 103. The conductive layer 106 includes a region that overlaps with at least the region 108C in the semiconductor layer 108 and the conductive layer 112. Here, an example where the conductive layer 106 overlaps with the region 108L1, the region 108L2, and part of the region 108N is illustrated.

In the transistor 100A, the conductive layer 106 has a function of a first gate electrode (also referred to as a bottom gate electrode), and the conductive layer 112 has a function of a second gate electrode (also referred to as a top gate electrode). Part of the insulating layer 103 functions as a first gate insulating layer, and part of the insulating layer 110 functions as a second gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 will be sometimes referred to as a channel formation region in the following description; however, a channel can also be actually formed in a portion not overlapping with the conductive layer 112 and overlapping with the conductive layer 106 (a portion including the region 108L1, the region 108L2, and the region 108N).

In addition, as illustrated in FIG. 6A and FIG. 6C, the conductive layer 106 may be electrically connected to the conductive layer 112 through an opening 142 provided in the metal oxide layer 114, the insulating layer 110, and the insulating layer 103. In that case, the same potential can be supplied to the conductive layer 106 and the conductive layer 112.

For the conductive layer 106, a material similar to that for the conductive layer 112, the conductive layer 120a, or the conductive layer 120b can be used. Specifically, a material containing copper is preferably used for the conductive layer 106, in which case wiring resistance can be reduced. When a material containing a high-melting-point metal such as tungsten or molybdenum is used for the conductive layer 106, treatment in a later step can be performed at high temperatures.

As illustrated in FIG. 6A and FIG. 6C, the conductive layer 112 and the conductive layer 106 preferably protrude beyond an end portion of the semiconductor layer 108 in the channel width direction. In that case, as illustrated in FIG. 6C, a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be supplied to the conductive layer 106 and the conductive layer 112. In that case, electric fields for inducing a channel can be effectively applied to the semiconductor layer 108, whereby the on-state current of the transistor 100A can be increased. Thus, the transistor 100A can also be miniaturized.

Note that a structure in which the conductive layer 112 and the conductive layer 106 are not connected to each other may be employed. In that case, a constant potential may be supplied to one of the pair of gate electrodes, and a signal for driving the transistor 100A may be supplied to the other. In this case, the potential supplied to one of the gate electrodes can control the threshold voltage at the time of driving the transistor 100A with the other electrode. Alternatively, a structure in which one of the gate electrodes and a source electrode of the transistor 100A are electrically connected to each other may be employed.

The above is the description of Structure example 2.

Structure Example 3

A structure example of a transistor of one embodiment of the present invention will be described below. Note that description of the portions overlapping with the above is omitted in some cases.

Structure Example 3-1

Figure 7A:
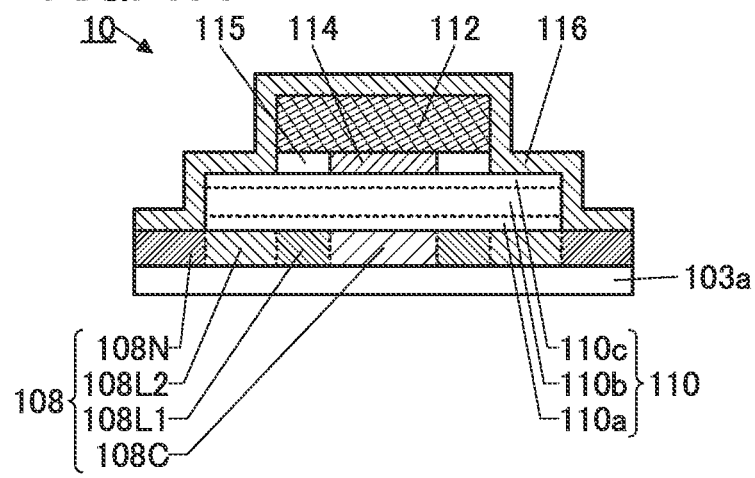
FIG. 7A and FIG. 7B are diagrams illustrating structure examples of a semiconductor device.

FIG. 7A shows a schematic cross-sectional view of a transistor 10 in the channel length direction.

The transistor 10 is provided over the insulating film 103a and includes the semiconductor layer 108, the insulating layer 110, the metal oxide layer 114, the conductive layer 112, and the insulating region 115. The insulating layer 116 is provided to cover the transistor 10. The semiconductor layer 108 includes the region 108C, the region 108L1, the region 108L2, and the region 108N.

The insulating film 103a is preferably formed using an insulating film containing an oxide. It is particularly preferable to use an oxide film for a portion in contact with the semiconductor layer 108.

The insulating layer 110 has a stacked-layer structure in which an insulating film 110a, an insulating film 110b, and an insulating film 110c are stacked in this order from the insulating film 103a side. The insulating film 110a includes a region in contact with the channel formation region of the semiconductor layer 108. The insulating film 110c includes a region in contact with the metal oxide layer 114. The insulating film 110b is positioned between the insulating film 110a and the insulating film 110c.

It is preferable that the insulating film 110a, the insulating film 110b, and the insulating film 110c be each an insulating film containing an oxide. In that case, the insulating film 110a, the insulating film 110b, and the insulating film 110c are preferably deposited successively with the same deposition apparatus.

For example, as the insulating film 110a, the insulating film 110b, and the insulating film 110c, it is possible to use an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

In addition, the insulating layer 110 that is in contact with the semiconductor layer 108 preferably has a stacked-layer structure of oxide insulating films and further preferably includes a region containing oxygen in excess of that in the stoichiometric composition. In other words, the insulating layer 110 includes an insulating film capable of releasing oxygen. It is also possible to supply oxygen into the insulating layer 110 by forming the insulating layer 110 in an oxygen atmosphere, performing heat treatment, plasma treatment, or the like on the deposited insulating layer 110 in an oxygen atmosphere, or depositing an oxide film over the insulating layer 110 in an oxygen atmosphere, for example.

For example, the insulating film 110a, the insulating film 110b, and the insulating film 110c can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method.

In particular, the insulating film 110a, the insulating film 110b, and the insulating film 110c are preferably formed by a plasma CVD method.

The insulating film 110a is deposited over the semiconductor layer 108, and thus is preferably a film deposited under conditions where the semiconductor layer 108 is damaged as little as possible. For example, the insulating film 110a can be deposited under conditions where the deposition speed (also referred to as deposition rate) is sufficiently low.

For example, when a silicon oxynitride film is formed as the insulating film 110a by a plasma CVD method, damage to the semiconductor layer 108 can be extremely small by formation under a low-power condition.

For example, a source gas that contains a silicon-containing deposition gas such as silane or disilane and an oxidizing gas such as oxygen, ozone, dinitrogen monoxide, or nitrogen dioxide can be used for the deposition gas used for the deposition of the silicon oxynitride film. The deposition gas may contain a dilution gas such as argon, helium, or nitrogen in addition to the source gas.

For example, when the proportion of the flow rate of the deposition gas in the total flow rate of the deposition gas (hereinafter also simply referred to as a flow rate ratio) is low, the deposition rate can be made low, which allows deposition of a dense film with few defects.

The insulating film 110b is preferably a film deposited under conditions where the deposition rate is higher than that of the insulating film 110a. Thus, the productivity can be improved.

For example, the insulating film 110b can be deposited under conditions where the deposition rate is increased by setting the flow rate ratio of the deposition gas to be higher than that of the insulating film 110a.

The insulating film 110c is preferably an extremely dense film whose surface has fewer defects and is less likely to adsorb an impurity contained in the air such as water. For example, like the insulating film 110a, the insulating film 110c can be deposited under conditions where the deposition rate is sufficiently low.

Since the insulating film 110c is deposited over the insulating film 110b, the deposition of the insulating film 110c affects the semiconductor layer 108 less than the deposition of the insulating film 110a. Thus, the insulating film 110c can be deposited under conditions where the power is higher than that for the insulating film 110a. By reducing the flow rate ratio of the deposition gas and performing deposition with relatively high power, a dense film whose surface has fewer defects can be achieved.

That is, for the insulating layer 110, it is possible to use a stacked-layer film deposited under conditions in which the deposition rate is higher in the order of the insulating film 110b, the insulating film 110a, and the insulating film 110c.

In wet etching or dry etching under the same condition, the insulating film 110b, the insulating film 110a, and the insulating film 110c of the insulating layer 110 have higher etching rate in this order.

The insulating film 110b is preferably formed to be thicker than the insulating film 110a and the insulating film 110c. The time taken for the deposition process of the insulating layer 110 can be shortened by forming the insulating film 110b, which is deposited at the highest deposition rate, to be thick.

Here, the boundary between the insulating film 110a and the insulating film 110b and the boundary between the insulating film 110b and the insulating film 110c are sometimes unclear and thus are clearly shown by dashed lines in FIG. 7A and the like. Note that since the insulating film 110a and the insulating film 110b have different film densities, the boundary therebetween can be observed as a difference in contrast in a transmission electron microscope (TEM) image or the like of a cross section of the insulating layer 110 in some cases. Similarly, the boundary between the insulating film 110b and the insulating film 110c can be observed in some cases.

Structure Example 3-2

Figure 7B:
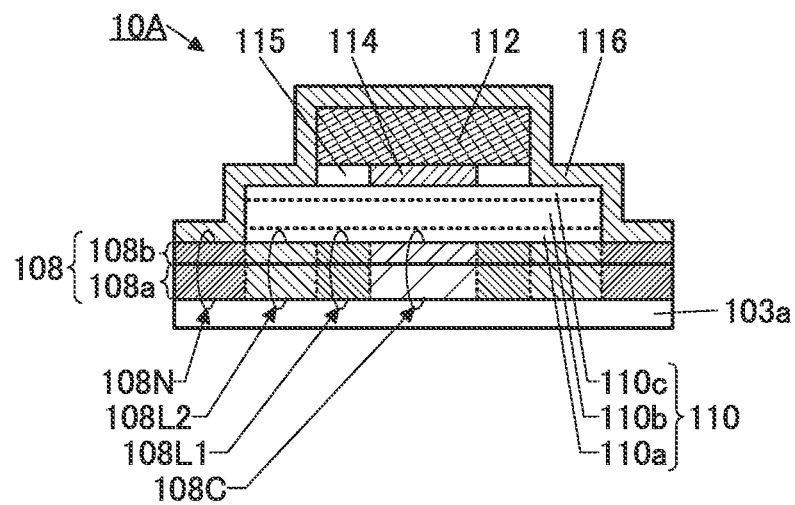

FIG. 7B is a schematic cross-sectional view of a transistor 10A. The transistor 10A is different from the transistor 10 mainly in the structure of the semiconductor layer 108.

The semiconductor layer 108 included in the transistor 10A has a stacked-layer structure in which a semiconductor layer 108a and a semiconductor layer 108b are stacked from the insulating film 103a side. A metal oxide film is preferably used as each of the semiconductor layer 108a and the semiconductor layer 108b.

Note that, for simplicity, each region included in the semiconductor layer 108a and each region included in the semiconductor layer 108b are collectively denoted by the region 108C, the region 108L1, the region 108L2 and the region 108N. The semiconductor layer 108a and the semiconductor layer 108b actually differ in their compositions and the like; therefore, the region 108C, the region 108L1, the region 108L2 and the region 108N have different electric resistivities, carrier concentrations, amounts of oxygen vacancies, hydrogen concentrations, impurity concentrations, or the like in some cases.

The semiconductor layer 108b is in contact with the top surface of the semiconductor layer 108a and the bottom surface of the insulating film 110a.

For example, a metal oxide film that has a higher atomic ratio of gallium than the semiconductor layer 108b can be used as the semiconductor layer 108a.

Gallium has a higher bonding strength with oxygen than indium; therefore, when a metal oxide film having a high atomic ratio of gallium is used as the semiconductor layer 108a, oxygen vacancies are less likely to be formed. When many oxygen vacancies exist in the semiconductor layer 108a, the electrical characteristics and reliability of the transistor are reduced. Therefore, when a metal oxide film that has a higher atomic ratio of gallium than the semiconductor layer 108b is used as the semiconductor layer 108a, the transistor 10A with favorable electrical characteristics and high reliability can be achieved.

Specifically, it is preferable that a metal oxide film which contains indium, gallium, and zinc, and includes a region which has a higher atomic ratio of gallium and a lower atomic ratio of indium than the semiconductor layer 108b is used favorably for the semiconductor layer 108a. In other words, it is preferable that a metal oxide film which includes a region having a higher atomic ratio of indium and a lower atomic ratio of gallium than the semiconductor layer 108a be used as the semiconductor layer 108b.

It is preferable to use, as the semiconductor layer 108a, a metal oxide film which includes a region having an atomic ratio of zinc equal to an atomic ratio of zinc in the semiconductor layer 108b or a region having an atomic ratio of zinc lower than an atomic ratio of zinc in the semiconductor layer 108b.

For example, a metal oxide film having any of the following atomic ratios of metal elements can be used as the semiconductor layer 108a: In:Ga:Zn=1:1:1, In:Ga:Zn=1:3:2, In:Ga:Zn=1:3:4, In:Ga:Zn=1:3:6, In:Ga:Zn=2:2:1, and a neighborhood thereof.

For example, a metal oxide film having any of the following atomic ratios of metal elements can be used as the semiconductor layer 108b: In:Ga:Zn=2:1:3, In:Ga:Zn=3:1:2, In:Ga:Zn=4:2:3, In:Ga:Zn=4:2:4.1, In:Ga:Zn=5:1:6, In:Ga:Zn=5:1:7, In:Ga:Zn=5:1:8, In:Ga:Zn=6:1:6, In:Ga:Zn=5:2:5, and a neighborhood thereof.

Typically, it is preferable to use a metal oxide film having an atomic ratio of metal elements of In:Ga:Zn=1:1:1 or a neighborhood thereof as the semiconductor layer 108a, and to use a metal oxide film having an atomic ratio of metal elements of In:Ga:Zn=4:2:3, 5:1:6, or a neighborhood thereof as the semiconductor layer 108b.

A metal oxide film that has a relatively high gallium content percentage is used as the semiconductor layer 108a positioned on the insulating film 103a side in the transistor 10A, whereby oxygen vacancies in the semiconductor layer 108 are reduced. Furthermore, in the transistor 10A, a metal oxide film which has a low gallium content percentage or does not contain gallium is used as the semiconductor layer 108b positioned on the insulating layer 110 side, whereby the defect density of the interface between the semiconductor layer 108 and the insulating layer 110 is reduced. Therefore, the transistor 10A is a transistor with both extremely high electrical characteristics and extremely high reliability.

Here, the semiconductor layer 108b is preferably formed thinner than the semiconductor layer 108a. Even when the semiconductor layer 108b is as extremely thin as 0.5 nm or more and 10 nm or less, for example, the defect density of the interface with the insulating layer 110 can be reduced. In contrast, the semiconductor layer 108a in which oxygen vacancies are less likely to be generated is made to be relatively thick, whereby the transistor can have higher reliability.

For example, the thickness of the semiconductor layer 108a can be 1.5 to 20 times, preferably 2 to 15 times, further preferably 3 to 10 times the thickness of the semiconductor layer 108b. The thickness of the oxide semiconductor layer 108b is greater than or equal to 0.5 nm and less than or equal to 30 nm, preferably greater than or equal to 1 nm and less than or equal to 20 nm, further preferably greater than or equal to 2 nm and less than or equal to 10 nm.

It is preferable to use a metal oxide film having crystallinity as each of the semiconductor layer 108a and the semiconductor layer 108b. A metal oxide film having high crystallinity or a metal oxide film having low crystallinity may be used as both the semiconductor layer 108a and the semiconductor layer 108b. Alternatively, the semiconductor layer 108a and the semiconductor layer 108b may have different crystallinities. For example, the semiconductor layer 108a may have higher crystallinity than the semiconductor layer 108b, or the semiconductor layer 108b may have higher crystallinity than the semiconductor layer 108a. The crystallinity of the metal oxide film used as each of the semiconductor layer 108a and the semiconductor layer 108b can be determined on the basis of the required electrical characteristics and reliability of the transistor and specifications of a deposition apparatus or the like.

The oxide semiconductor layer 108a and the oxide semiconductor layer 108b may be formed using metal oxide films with the same compositions. At this time, a metal oxide film having higher crystallinity than the semiconductor layer 108a is preferably used as the semiconductor layer 108b. This can reduce the effect of the damage caused to the semiconductor layer 108 at the time of depositing the insulating layer 110, whereby a transistor with high reliability can be achieved. With the use of a metal oxide film with low crystallinity as the semiconductor layer 108a, a transistor with increased field-effect mobility can be achieved.

Structure Example 3-3

FIG. 8A is a schematic cross-sectional view of a transistor 10B. The transistor 10B is different from the transistor 10 mainly in that the insulating layer 103 having a stacked-layer structure is included. FIG. 8B shows a schematic cross-sectional view of a transistor 10C in which the conductive layer 106 is provided in addition to the structure of the transistor 10B.

Since the structure of the transistor 10B and that of the transistor 10C are the same except for the conductive layer 106, the transistor 10C is described here.

The conductive layer 106 includes a region overlapping with the semiconductor layer 108, the insulating layer 110, the metal oxide layer 114, and the conductive layer 112 with the insulating layer 103 therebetween. The conductive layer 106 functions as a first gate electrode (also referred to as a back gate electrode). The insulating layer 103 functions as a first gate insulating layer. In this case, the conductive layer 112 functions as a second gate electrode, and the insulating layer 110 functions as a second gate insulating layer.

For example, when the same potential is supplied to the conductive layer 112 and the conductive layer 106, the amount of current which can flow in the transistor 10C in an on state can be increased. In the transistor 10C, a potential for controlling the threshold voltage can be supplied to one of the conductive layer 112 and the conductive layer 106, and a potential for controlling an on/off state of the transistor 10C can be supplied to the other of the conductive layer 112 and the conductive layer 106.

The insulating layer 103 has a stacked-layer structure in which the insulating film 103a, an insulating film 103b1, an insulating film 103b2, and an insulating film 103b3 are stacked from the semiconductor layer 108 side. The insulating film 103b3 is in contact with the conductive layer 106. The insulating film 103a is in contact with the semiconductor layer 108.

The insulating layer 103 functioning as the first gate insulating layer preferably satisfies at least one of the following characteristics, further preferably satisfies all of the following characteristics: high withstand voltage, low stress, unlikeliness of releasing hydrogen and water, a small number of defects, and prevention of diffusion of metal elements contained in the conductive layer 106.

An insulating film containing nitrogen is preferably used as the insulating film 103b3, the insulating film 103b2 and the insulating film 103b1 positioned on the conductive layer 106 side among the four insulating films included in the insulating layer 103. In contrast, an insulating film containing oxygen is preferably used as the insulating film 103a in contact with the semiconductor layer 108. The four insulating films included in the insulating layer 103 are preferably deposited successively without exposure to the air with a plasma CVD apparatus.

As each of the insulating film 103b1, the insulating film 103b2, and the insulating film 103b3, an insulating film containing nitrogen, such as a silicon nitride film, a silicon nitride oxide film, an aluminum nitride film, or a hafnium nitride film, can be used. Furthermore, as the insulating film 103a, an insulating film that can be used as the insulating layer 110 can also be used.

The insulating film 103b1 and the insulating film 103b3 are preferably dense films that can prevent diffusion of impurities from the layers below. It is preferable that the insulating film 103b3 be able to block a metal element contained in the conductive layer 106 and that the insulating film 103b1 be able to block hydrogen and water contained in the insulating film 103b2. Thus, an insulating film that is deposited at a lower deposition rate than the insulating film 103b2 can be used as each of the insulating film 103b3 and the insulating film 103b1.

In contrast, it is preferable that an insulating film having low stress and being deposited at a high deposition rate is used as the insulating film 103b2. The insulating film 103b2 is preferably formed to be thicker than each of the insulating film 103b1 and the insulating film 103b3.

For example, even in the case where silicon nitride films deposited by a plasma CVD method are used as the insulating film 103b1, the insulating film 103b2, and the insulating film 103b3, the film density of the insulating film 103b2 is smaller than the film densities of the other two insulating films. Thus, in a transmission electron microscope image or the like of a cross section of the insulating layer 103, difference in contrast can be observed in some cases. Since a boundary between the insulating film 103b3 and the insulating film 103b2 and a boundary between the insulating film 103b2 and the insulating film 103b1 are unclear in some cases, the boundaries are denoted by dashed lines in FIG. 8A and FIG. 8B.

As the insulating film 103a in contact with the semiconductor layer 108, it is preferable to use a dense insulating film on a surface of which an impurity such as water is less likely to be adsorbed. In addition, it is preferable to use an insulating film in which defects are as little as possible and impurities such as water and hydrogen are reduced. For example, an insulating film similar to the insulating film 110c included in the insulating layer 110 can be used as the insulating film 103a.

For example, in the case where a metal film or an alloy film whose constituent element is less likely to be diffused into the insulating layer 103 is used as the conductive layer 106, a structure may be employed in which the insulating film 103b3 is not provided and the three insulating films of the insulating film 103b2, the insulating film 103b1, and the insulating film 103a are stacked.

With the insulating layer 103 having such a stacked-layer structure, a transistor with extremely high reliability can be achieved.

Fabrication Method Example

A fabrication method example of a transistor of one embodiment of the present invention will be described below. Here, description will be made giving, as an example, the transistor 100A illustrated in Structure example 2.

Note that thin films that form the semiconductor device (insulating films, semiconductor films, conductive films, and the like) can be formed by a sputtering method, a chemical vapor deposition (CVD)method, a vacuum evaporation method, a pulsed laser deposition (PLD)method, an atomic layer deposition (ALD) method, or the like. Examples of the CVD method include a plasma-enhanced chemical vapor deposition (PECVD: Plasma Enhanced CVD) method and a thermal CVD method. In addition, examples of the thermal CVD method include a metal organic chemical vapor deposition (MOCVD) method.

The thin films that form the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that form the semiconductor device ae processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, and the thin film is processed by etching or the like, then the resist mask is removed. In the other method, after a photosensitive thin film is formed, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

In each of drawings shown in FIG. 9 and FIG. 10, cross sections of the transistor 100A in the channel length direction and in the channel width direction in each step in the fabrication process are shown side by side.

<Formation of Conductive Layer 106>

Figure 9A:
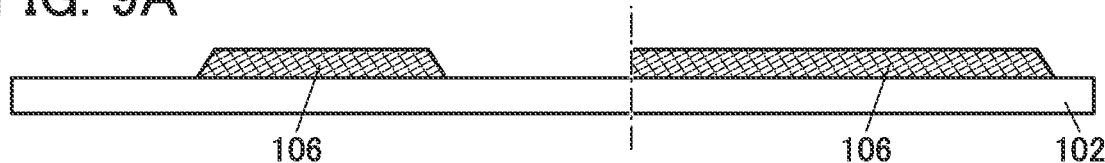
FIG. 9A to FIG. 9F are diagrams showing a fabrication method example of a semiconductor device.

A conductive film is deposited over the substrate 102 and processed by etching, whereby the conductive layer 106 functioning as a gate electrode is formed (FIG. 9A).

At this time, as illustrated in FIG. 9A, the conductive layer 106 is preferably processed so as to have an end portion with a tapered shape. In that case, the step coverage of the insulating layer 103 formed in a next step can be improved.

When a conductive film containing copper is used as the conductive film to be the conductive layer 106, wiring resistance can be reduced. For example, a conductive film containing copper is preferably used in the case where the transistor is used in a large display device or a display device with a high resolution. Even in the case where a conductive film containing copper is used as the conductive layer 106, diffusion of copper to the semiconductor layer 108 side can be suppressed by the insulating layer 103, whereby a transistor with high reliability can be achieved.

<Formation of Insulating Layer 103>

Figure 9B:
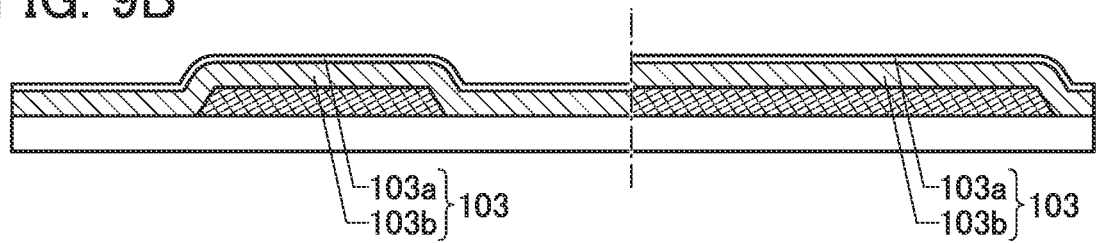

Then, the insulating layer 103 is formed to cover the substrate 102 and the conductive layer 106 (FIG. 9B). The insulating layer 103 can be formed by a PECVD method, an ALD method, a sputtering method, or the like.

Here, the insulating layer 103 is formed by stacking the insulating film 103b and the insulating film 103a in this order.

In particular, each of the insulating layers included in the insulating layer 103 is preferably formed by a PECVD method. For the method for forming the insulating layer 103, the description in Structure example 3 can be referred to.

After the insulating layer 103 is formed, treatment for supplying oxygen to the insulating layer 103 may be performed. For example, plasma treatment, heat treatment, or the like in an oxygen atmosphere can be performed. Alternatively, oxygen may be supplied to the insulating layer 103 by a plasma ion doping method or an ion implantation method. Alternatively, oxygen can be supplied to the insulating layer 103 by depositing a metal oxide film over the insulating layer 103 in an atmosphere containing oxygen. At this time, the metal oxide film is preferably removed.

<Formation of Semiconductor Layer 108>

Then, a metal oxide film is deposited over the insulating layer 103.

The metal oxide film is preferably formed by a sputtering method using a metal oxide target.

The metal oxide film is preferably a dense film with as few defects as possible. The metal oxide film is preferably a highly purified film in which impurities such as hydrogen and water are reduced as much as possible. It is particularly preferable to use a metal oxide film having crystallinity as the metal oxide film.

In addition, an oxygen gas and an inert gas (such as a helium gas, an argon gas, or a xenon gas) may be mixed in depositing the metal oxide film. Note that when the proportion of an oxygen gas in the whole deposition gas (hereinafter also referred to as an oxygen flow rate ratio) at the time of depositing the metal oxide film is higher, the crystallinity of the metal oxide film can be higher and a transistor with higher reliability can be achieved. In contrast, when the oxygen flow rate ratio is lower, the crystallinity of the metal oxide film is lower and a transistor with a higher on-state current can be achieved.

In depositing the metal oxide film, as the substrate temperature becomes higher, a denser metal oxide film having higher crystallinity can be formed. On the other hand, as the substrate temperature becomes lower, a metal oxide film having lower crystallinity and higher electric conductivity can be formed.

The metal oxide film is formed under the deposition conditions where the substrate temperature is higher than or equal to room temperature and lower than or equal to 250° C., preferably higher than or equal to room temperature and lower than or equal to 200° C., more preferably higher than or equal to room temperature and lower than or equal to 140° C. For example, when the deposition temperature is higher than or equal to room temperature and lower than 140° C., high productivity is achieved, which is preferable. When the metal oxide film is deposited with the substrate temperature set at room temperature or without intentional heating, the crystallinity can be made low.

In addition, it is preferable to perform treatment for desorbing water, hydrogen, an organic substance, or the like adsorbed onto a surface of the insulating layer 103 or treatment for supplying oxygen into the insulating layer 103 before deposition of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. Alternatively, oxygen may be supplied to the insulating layer 103 by plasma treatment in an atmosphere containing an oxidizing gas such as dinitrogen monoxide ($N_2O$). When plasma treatment containing dinitrogen monoxide gas is performed, oxygen can be supplied to the insulating layer 103 while favorably removing an organic substance on the surface of the insulating layer 103. After such treatment, the metal oxide film is preferably deposited successively without exposure of the surface of the insulating layer 103 to the air.

Note that in the case where the semiconductor layer 108 has a stacked-layer structure in which a plurality of semiconductor layers are stacked, an upper metal oxide film is preferably deposited successively after the deposition of a lower metal oxide film without exposure of the surface of the lower metal oxide layer to the air.

Figure 9C:
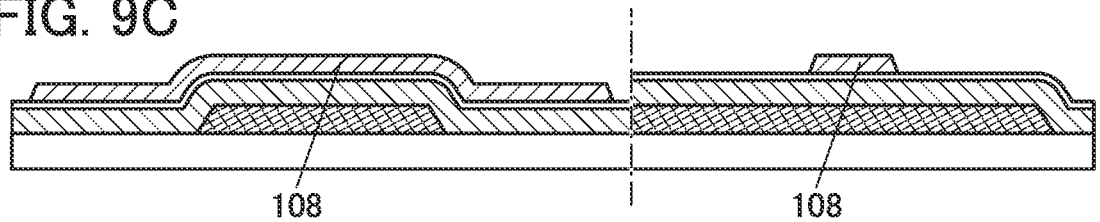

Next, the metal oxide film is partly etched, so that the island-shaped semiconductor layer 108 is formed (FIG. 9C).

For processing of the metal oxide film, either one or both of a wet etching method and a dry etching method are used. At this time, part of the insulating layer 103 that does not overlap with the semiconductor layer 108 is etched and thinned in some cases. For example, in some cases, the insulating film 103a of the insulating layer 103 is removed by etching and the surface of the insulating film 103b is exposed.

Here, it is preferable that heat treatment be performed after the metal oxide film is deposited or after the metal oxide film is processed into the semiconductor layer 108. By the heat treatment, hydrogen or water contained in the metal oxide film or the semiconductor layer 108 or adsorbed on the surface of the metal oxide film or the semiconductor layer 108 can be removed. The film quality of the metal oxide film or the semiconductor layer 108 is improved (e.g., the number of defects is reduced or crystallinity is increased) by the heat treatment in some cases.

Oxygen can be supplied from the insulating layer 103 to the metal oxide film or the semiconductor layer 108 by the heat treatment. At this time, it is further preferable that the heat treatment be performed before the metal oxide film is processed into the semiconductor layer 108.

The temperature of the heat treatment can be typically higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Alternatively, heating may be performed in a clean dry air (CDA) atmosphere. It is preferable that the atmosphere of the above heat treatment contain as little hydrogen, water, or the like as possible. An electric furnace, an RTA (Rapid Thermal Anneal) apparatus, or the like can be used for the heat treatment. The use of the RTA apparatus can shorten the heat treatment time.

Note that the heat treatment is not necessarily performed. The heat treatment is not necessarily performed in this step, and heat treatment performed in a later step may also serve as the heat treatment in this step. In some cases, treatment at a high temperature (e.g., deposition step) or the like in a later step can serve as the heat treatment.

<Formation of Insulating Film 110f>

Figure 9D:
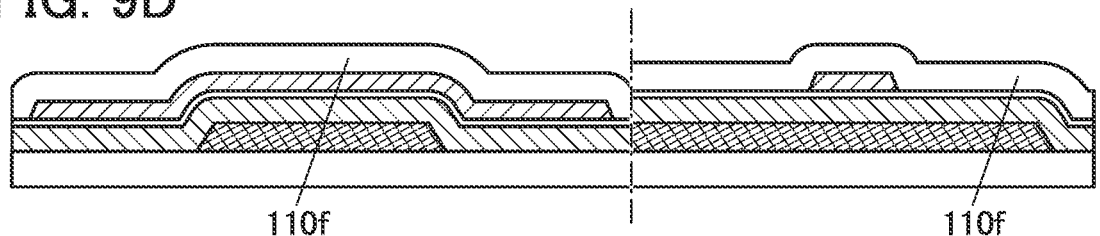

Next, an insulating film 110f is formed to cover the insulating layer 103 and the semiconductor layer 108 (FIG. 9D).

The insulating film 110f is preferably formed by a PECVD method.

It is preferable to perform plasma treatment on a surface of the semiconductor layer 108 before deposition of the insulating film 110f. By the plasma treatment, impurities such as water adsorbed onto the surface of the semiconductor layer 108 can be reduced. Therefore, impurities at the interface between the semiconductor layer 108 and the insulating film 110f can be reduced, whereby a transistor with high reliability can be achieved. Performing the plasma treatment in this manner is particularly favorable in the case where the surface of the semiconductor layer 108 is exposed to the air after the formation of the semiconductor layer 108 and before the deposition of the insulating film 110f. For example, the plasma treatment can be performed in an atmosphere containing oxygen, ozone, nitrogen, dinitrogen monoxide, argon, or the like. The plasma treatment and the deposition of the insulating film 110f are preferably performed successively without exposure to the air.

After the insulating film 110f is deposited, heat treatment is preferably performed. By the heat treatment, hydrogen or water contained in the insulating film 110f or adsorbed on its surface can be removed. In addition, the number of defects in the insulating film 110f can be reduced. For the conditions of the heat treatment, the above description can be referred to.

Note that the heat treatment is not necessarily performed. The heat treatment is not necessarily performed in this step, and heat treatment performed in a later step may also serve as the heat treatment in this step. In some cases, treatment at a high temperature (e.g., deposition step) or the like in a later step can serve as the heat treatment.

<Formation of Metal Oxide Film 114f>

Figure 9E:
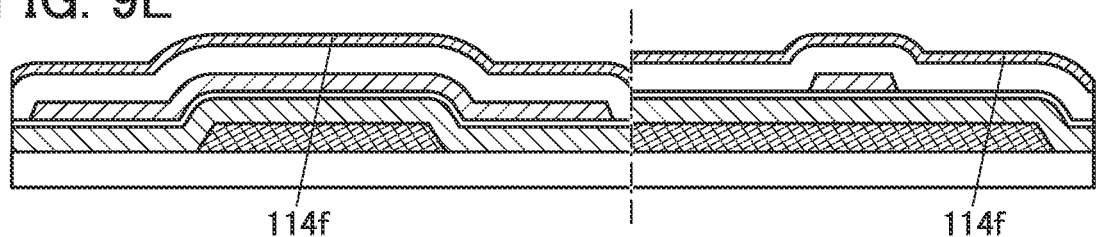

Then, a metal oxide film 114f is formed over the insulating film 110f (FIG. 9E).

The metal oxide film 114f is preferably deposited in an oxygen-containing atmosphere, for example. It is particularly preferable that the metal oxide layer 114 be formed by a sputtering method in an oxygen-containing atmosphere. Thus, oxygen can be supplied to the insulating film 110f at the time of depositing the metal oxide film 114f.

The above description can be referred to for the case where the metal oxide film 114f is formed by a sputtering method using an oxide target containing a metal oxide as in the case of the semiconductor layer 108.

For example, as deposition conditions of the metal oxide film 114f, a metal oxide film may be formed by a reactive sputtering method with a metal target using oxygen as a deposition gas. When aluminum is used for the metal target, for example, an aluminum oxide film can be deposited.

At the time of depositing the metal oxide film 114f, the amount of oxygen supplied into the insulating film 110f can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than 0% and lower than or equal to 100%, preferably higher than or equal to 10% and lower than or equal to 100%, further preferably higher than or equal to 20% and lower than or equal to 100%, still further preferably higher than or equal to 30% and lower than or equal to 100%, and still further preferably higher than or equal to 40% and lower than or equal to 100%. It is particularly preferred that the oxygen flow rate ratio be 100% and the oxygen partial pressure be as close to 100% as possible.

When the metal oxide film 114f is formed by a sputtering method in an oxygen-containing atmosphere in the above manner, oxygen can be supplied to the insulating film 110f and release of oxygen from the insulating film 110f can be prevented during the deposition of the metal oxide film 114f. As a result, an extremely large amount of oxygen can be enclosed in the insulating film 110f.

After the deposition of the metal oxide film 114f, heat treatment is preferably performed. When the heat treatment is performed, oxygen contained in the insulating film 110f can be supplied to the semiconductor layer 108. When heating is performed while the metal oxide film 114f covers the insulating film 110f, oxygen can be prevented from being released from the insulating film 110f to the outside, and a large amount of oxygen can be supplied to the semiconductor layer 108. Thus, the amount of oxygen vacancies in the semiconductor layer 108 can be reduced, leading to a transistor with high reliability.

For the conditions of the heat treatment, the above description can be referred to.

Note that the heat treatment is not necessarily performed. The heat treatment is not necessarily performed in this step, and heat treatment performed in a later step may also serve as the heat treatment in this step. In some cases, treatment at a high temperature (e.g., deposition step) or the like in a later step can serve as the heat treatment.

<Formation of Opening 142>

Then, parts of the metal oxide film 114f, the insulating film 110f, and the insulating layer 103 are etched to form the opening 142 reaching the conductive layer 106. Accordingly, the conductive layer 112 to be formed later can be electrically connected to the conductive layer 106 through the opening 142.

<Formation of Conductive Film 112f>

Figure 9F:
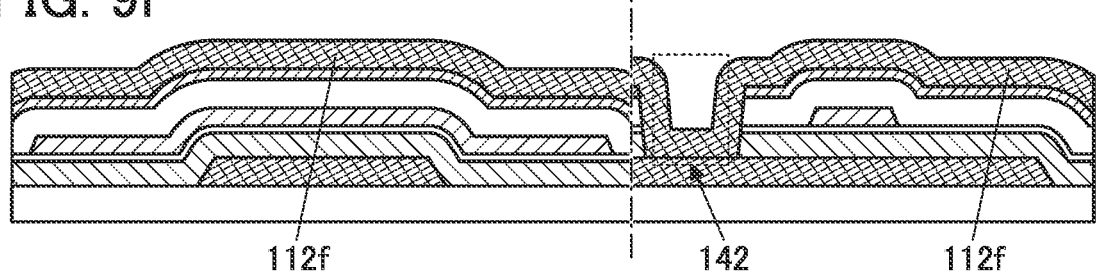

Then, a conductive film 112f to be the conductive layer 112 is deposited over the metal oxide film 114f (FIG. 9F).

For the conductive film 112f, a low-resistance metal or a low-resistance alloy material is preferably used. It is preferable that a material from which hydrogen is less likely to be released and in which hydrogen is less likely to be diffused is used for the conductive film 112f. Furthermore, a material that is less likely to be oxidized is preferably used for the conductive film 112f.

The conductive film 112f is preferably deposited by a sputtering method using a sputtering target containing a metal or an alloy, for example.

For example, the conductive film 112f is preferably a stacked-layer film of a conductive film which is less likely to be oxidized and in which hydrogen is less likely to be diffused and a low-resistance conductive film.

<Formation of Conductive Layer 112 and Metal Oxide Layer 114>

Figure 10A:
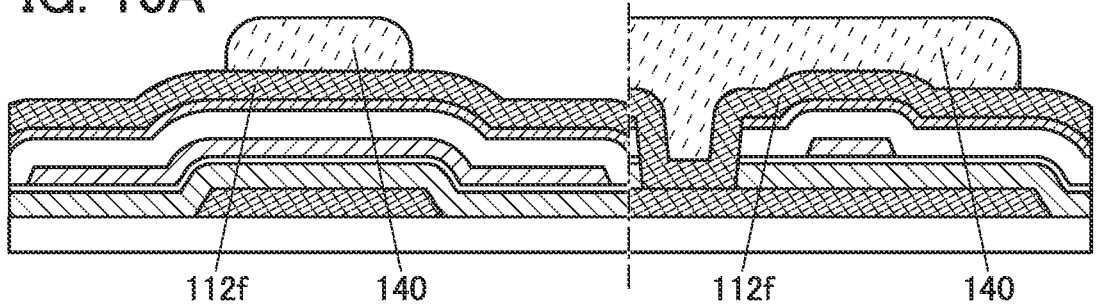
FIG. 10A to FIG. 10E are diagrams showing a fabrication method example of a semiconductor device.

Then, a resist mask 140 is formed over the conductive film 112f (FIG. 10A).

Figure 10B:
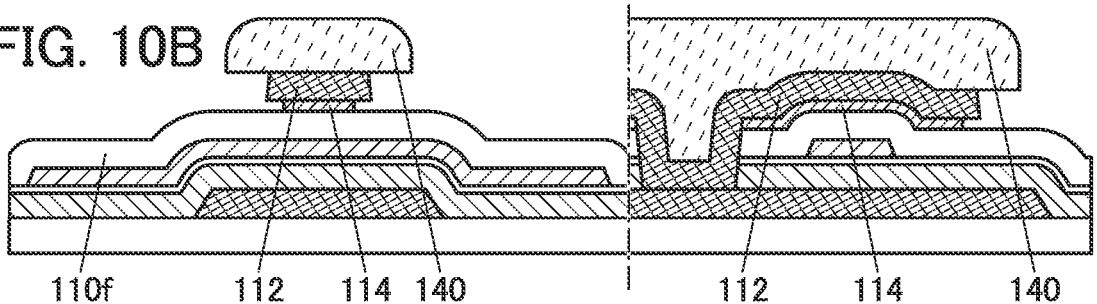

The conductive film 112f and the metal oxide film 114f are etched using the resist mask 140 as a mask, so that the conductive layer 112 and the metal oxide layer 114 are formed (FIG. 10B).

At this time, the conductive film 112f is etched so that the end portion of the conductive layer 112 is positioned inward from the end portion of the resist mask 140. Consequently, the insulating film 110f can be etched using the resist mask 140 in a later step. In addition, the processing is performed so that the end portion of the metal oxide layer 114 is positioned inward from the end portion of the conductive layer 112. Thus, a region to be the insulating region 115 later can be formed.

For example, after only the conductive film 112f is etched to form the conductive layer 112, the metal oxide film 114f can be etched to form the metal oxide layer 114. In that case, by using an isotropic etching method for both the etching of the conductive film 112f and the etching of the metal oxide film 114f, the conductive layer 112 and the metal oxide layer 114 whose end portions are positioned inward from the end portion of the resist mask 140 can be formed. For example, an isotropic dry etching method may be used; however, since the use of an isotropic dry etching method may etch part of the resist mask 140, it is more preferable to use a wet etching method.

Alternatively, the conductive film 112f and the metal oxide film 114f may be etched in an one-time etching treatment. At this time, it is preferable to employ an isotropic etching method where the etching rate of the metal oxide film 114f is higher than the etching rate of the conductive film 112f.

Alternatively, the conductive layer 112 and the metal oxide layer 114 can be formed as follows; first, both the conductive film 112f and the metal oxide film 114f are processed in a one-time etching treatment so that the top surface shapes thereof are substantially the same, then etching treatment is performed to make the end portion of the metal oxide film 114f recede.

When the conductive film 112f or the metal oxide film 114f is etched, part of the insulating film 110f is etched to be thin in some cases. For example, the shape shown in FIG. 2A and the like is an example where the top portion of the insulating film 110f to be the insulating layer 110 is etched at the time of etching of the conductive film 112f and the metal oxide film 114f.

<Formation of Insulating Layer 110>

Figure 10C:
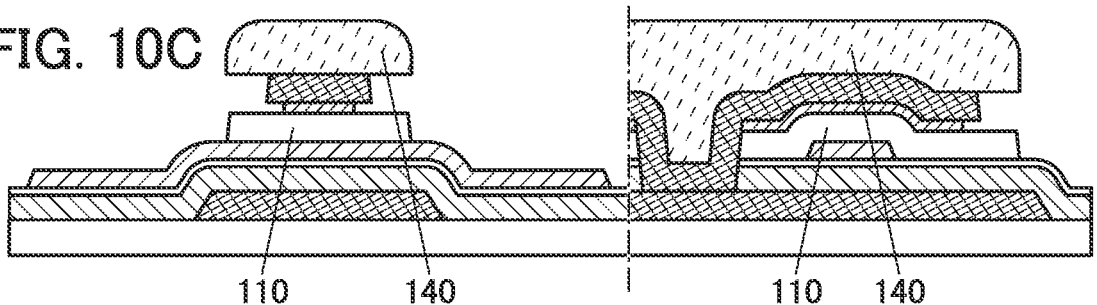

Next, the insulating film 110f is etched using the resist mask 140 to form the insulating layer 110 (FIG. 10C).

For the etching of the insulating film 110f an anisotropic etching method is preferably used. For example, an anisotropic dry etching method can be favorably used.

After the etching of the insulating film 110f, the resist mask 140 is removed.

Through the above steps, the insulating layer 110, the conductive layer 112 with the end portion positioned inward from the end portion of the insulating layer 110, and the metal oxide layer 114 with the end portion positioned inward from the end portion of the conductive layer 112 can be processed using the same resist mask 140.

Note that different resist masks can be used for the processing of the conductive layer 112 and the metal oxide layer 114 and the processing of the insulating layer 110.

Note that at the time of the etching of the insulating film 110f, the insulating film 103a not covered with the resist mask 140 is etched to be thin or to be removed, in some cases.

<Formation of Insulating Layer 116>

Figure 10D:
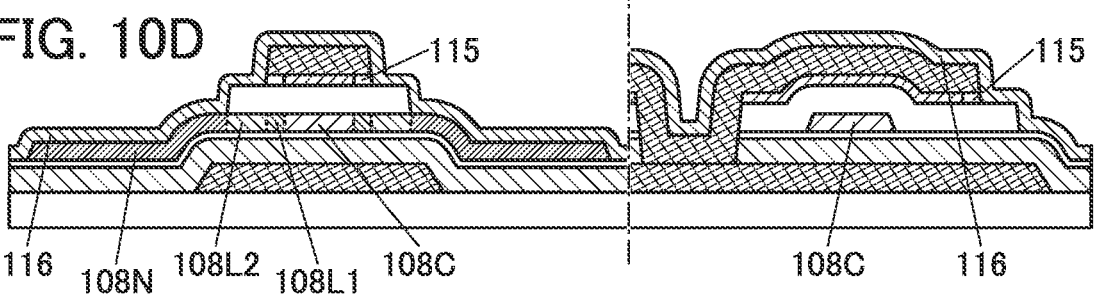

Next, the insulating layer 116 is formed in contact with the exposed portion of the semiconductor layer 108 (FIG. 10D). By the formation of the insulating layer 116, the resistance of the exposed region of the semiconductor layer 108 is reduced, so that the region 108N is formed. The insulating region 115 is formed simultaneously with the formation of the insulating layer 116.

As the insulating layer 116, an insulating film that releases an impurity element having a function of reducing the resistance of the semiconductor layer 108 can be used. In particular, an inorganic insulating film that can release hydrogen, such as a silicon nitride film, a silicon nitride oxide film, or a silicon oxynitride film, is preferably used. Here, a plasma CVD method using a deposition gas containing hydrogen is preferably used because hydrogen can be supplied to the semiconductor layer 108 at the time of deposition of the insulating layer 116.

For example, in the case where silicon nitride is used for the insulating layer 116, the insulating layer 116 is preferably formed by a PECVD method using a mixed gas of a gas containing silicon, such as silane, and a gas containing nitrogen, such as ammonia or dinitrogen monoxide, as a deposition gas. In this case, it is preferable that the deposited silicon nitride contain hydrogen. Thus, hydrogen in the insulating layer 116 is diffused into the semiconductor layer 108, whereby the resistance of part of the semiconductor layer 108 can be easily reduced.

It is preferable that the substrate 102 be held in a state where the substrate 102 is heated in a reduced-pressure atmosphere for a certain period at the time of deposition of the insulating layer 116. Accordingly, oxygen is released from the exposed region of the semiconductor layer 108, so that an oxygen vacancy can be generated. When hydrogen is supplied to the region at the time of deposition of the insulating layer 116, the resistance of the region 108N can be reduced more effectively.

Note that the resistance of the semiconductor layer 108 can be reduced by diffusion of part of the component of the deposition gas of the insulating layer 116 into part of the semiconductor layer 108 at the time of deposition of the insulating layer 116. For example, the resistance of the semiconductor layer 108 can be reduced by diffusion of nitrogen into part of the semiconductor layer 108.

The hydrogen supplied to the region 108N in the semiconductor layer 108 may be diffused into the region 108L2 and the region 108L1 by the heat at the time of deposition of the insulating layer 116 or by beat treatment after the deposition of the insulating layer 116. At this time, as for the carrier concentration of the semiconductor layer 108, a concentration gradient can be formed such that the concentration decreases from the region 108N to the region 108L1. For example, the carrier concentration of the semiconductor layer 108 is the lowest in the region 108C and higher in the order of the region 108L1, the region 108L2, and the region 108N.

Alternatively, an insulating film having a function of generating oxygen vacancies in the semiconductor layer 108 can be used. It is particularly preferable to use an insulating film containing a metal nitride. For example, it is preferable to form the insulating layer 116 by a reactive sputtering method using a sputtering target containing metal and, as a deposition gas, a mixed gas of a nitrogen gas and a rare gas or the like that is a dilution gas. Thus, the film quality of the insulating layer 116 can be easily controlled by controlling the flow rate ratio of the deposition gas.

For example, in the case where an aluminum nitride film formed by reactive sputtering using an aluminum target is used as the insulating layer 116, the flow rate of a nitrogen gas to the total flow rate of the deposition gas is preferably higher than or equal to 30% and lower than or equal to 100%, further preferably higher than or equal to 40% and lower than or equal to 100%, still further preferably higher than or equal to 50% and lower than or equal to 100%.

<Formation of Insulating Layer 118>

After the deposition of the insulating layer 116, the insulating layer 118 is deposited.

Here, the insulating layer 116 and the insulating layer 118 are preferably deposited successively without exposure to the air.

In the case where the insulating layer 118 is formed by a plasma CVD method at a deposition temperature too high, the impurity included in the region 108N and the like might diffuse into a peripheral portion including the channel formation region of the semiconductor layer 108 or might increase the electric resistance of the region 108N, in some cases. Therefore, the deposition temperature of the insulating layer 118 is determined in consideration of these.

The deposition temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Deposition of the insulating layer 118 at low temperatures enables the transistor to have favorable electrical characteristics even when it has a short channel length.

Heat treatment may be performed after the deposition of the insulating layer 116 or the deposition of the insulating layer 118. The heat treatment can promote the reduction in the resistance of the region 108N.

Refer to the above description for the conditions of the heat treatment.

Note that the heat treatment is not necessarily performed. The heat treatment is not necessarily performed in this step, and heat treatment performed in a later step may also serve as the heat treatment in this step. In some cases, treatment at a high temperature (e.g., deposition step) or the like in a later step can serve as the heat treatment.

<Formation of Opening 141a and Opening 141b>

Next, the insulating layer 118 and the insulating layer 116 are partly etched, whereby the opening 141a and the opening 141b that reach the region 108N are formed.

<Formation of Conductive Layer 120a and Conductive Layer 120b>

Figure 10E:
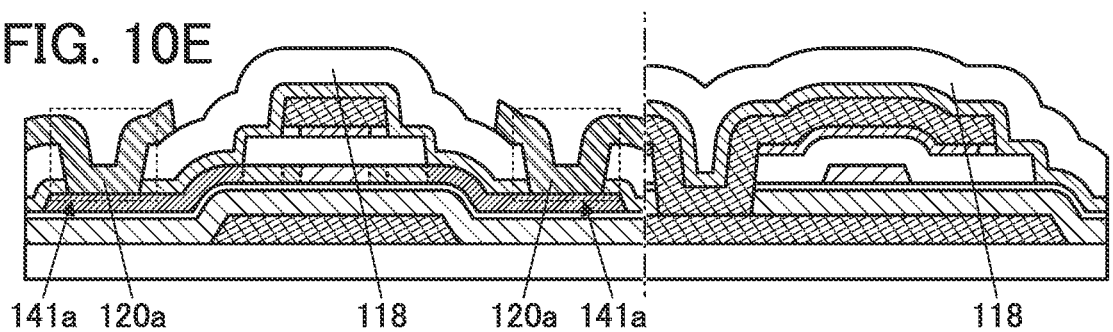

Next, a conductive film is deposited over the insulating layer 118 to cover the opening 141a and the opening 141b, and the conductive film is processed into a desired shape, so that the conductive layer 120a and the conductive layer 120b are formed (FIG. 10E).

Through the above steps the transistor 100A can be fabricated. In the case where the transistor 100A is used in a pixel of a display device, for example, this process may be followed by a step of forming one or more of a protective insulating layer, a planarization layer, a pixel electrode, and a wiring.

The above is the description of the fabrication method example.

Note that in the case of fabricating the transistor 100 shown in Structure example 1, the step of forming the conductive layer 106 and the step of forming the opening 142 in the above fabrication method example are omitted.

The transistor 100 and the transistor 100A can be formed over one substrate through the same process.

[Components of Semiconductor Device]

Components included in the semiconductor device of this embodiment will be described below in detail.

<Substrate>

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102 and the semiconductor device may be formed directly on the flexible substrate. A separation layer may be provided between the substrate 102 and the semiconductor device. The separation layer can be used when part or the whole of the semiconductor device completed thereover is separated from the substrate 102 and transferred onto another substrate. In such a case, the semiconductor device can be transferred to a substrate having low heat resistance or a flexible substrate as well.

<Conductive Film>

The conductive layer 112 and the conductive layer 106 functioning as gate electrodes, the conductive layer 120a functioning as one of a source electrode and a drain electrode, and the conductive layer 120b functioning as the other of the source electrode and the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

An oxide conductor or a metal oxide film such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be applied to each of the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as the conductive film on the side in contact with the insulating layer functioning as a gate insulating film.

Furthermore, among the above metal elements, it is particularly preferable that any one or more metal elements selected from titanium, tungsten, tantalum, and molybdenum be included in the conductive layer 112, the conductive layer 106, the conductive layer 120a, and the conductive layer 120b. It is particularly preferable to use a tantalum nitride film. Since the tantalum nitride film has conductivity and a high barrier property against copper, oxygen, or hydrogen and releases little hydrogen from itself, it can be favorably used as the conductive film in contact with the semiconductor layer 108 or the conductive film in the vicinity of the semiconductor layer 108.

<Semiconductor Layer>

In the case where the semiconductor layer 108 is an In-M-Zn oxide, examples of the atomic ratio of metal elements of a sputtering target for depositing an In-M-Zn oxide are In:M:Zn=1:1:1, In:M:Zn=1:1:1.2, In:M:Zn=1:3:2, In:M:Zn=1:3:4, In:M:Zn=1:3:6, In:M:Zn=2:2:1, In:M:Zn=2:1:3, In:M:Zn=3:1:2, In:M:Zn=4:2:3, In:M:Zn=4:2:4.1, In:M:Zn=5:1:6, In:M:Zn=5:1:7, In:M:Zn=5:1:8, In:M:Zn=6:1:6, In:M:Zn=5:2:5, and the like.

A target containing a polycrystalline oxide is preferably used as the sputtering target, which facilitates formation of the semiconductor layer 108 having crystallinity. Note that the atomic ratio in the semiconductor layer 108 to be deposited varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is in some cases in the neighborhood of In:Ga:Zn=4:2:3 [atomic ratio].

Note that when the atomic ratio is described as In:Ga:Zn=4:2:3 or as being in the neighborhood thereof, the case is included where Ga is greater than or equal to 1 and less than or equal to 3 and Zn is greater than or equal to 2 and less than or equal to 4 with In being 4. In addition, when the atomic ratio is described as In:Ga:Zn=5:1:6 or as being in the neighborhood thereof, the case is included where Ga is greater than 0.1 and less than or equal to 2 and Zn is greater than or equal to 5 and less than or equal to 7 with In being 5. Furthermore, when the atomic ratio is described as In:Ga:Zn=1:1:1 or as being in the neighborhood thereof, the case is included where Ga is greater than 0.1 and less than or equal to 2 and Zn is greater than 0.1 and less than or equal to 2 with In being 1.

The energy gap of the semiconductor layer 108 is 2 eV or more, preferably 2.5 eV or more. With the use of such a metal oxide having a wider energy gap than silicon, the off-state current of the transistor can be reduced.

A metal oxide with a low carrier concentration is preferably used for the semiconductor layer 108. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor has normally-on characteristics in some cases. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing much hydrogen is likely to have normally-on characteristics.

A defect in which hydrogen has entered an oxygen vacancy can function as a donor of the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases.

Therefore, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

The carrier concentration of the metal oxide in the channel formation region is preferably lower than or equal to $1\times10^{19}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the metal oxide in the channel formation region is not particularly limited and can be, for example, $1\times10^{-9}$ cm$^{-3}$.

Furthermore, the semiconductor layer 108 preferably has a non-single-crystal structure. The non-single-crystal structure includes, for example, a CAAC structure which is described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) is described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in the film thickness direction, the normal direction of the surface where the thin film is formed, or the normal direction of the surface of the thin film.

A CAAC-OS (Oxide Semiconductor) is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis in the unit cell. In particular, in the case of a crystal having a layered structure, two axes parallel to the plane direction of a layer are regarded as the a-axis and the b-axis and an axis intersecting with the layer is regarded as the c-axis in general. A typical example of such a crystal having a layered structure is graphite, which is classified as a hexagonal system. In a unit cell of graphite, the a-axis and the b-axis are parallel to the cleavage plane and the c-axis is orthogonal to the cleavage plane. For example, an InGaZnO$_4$ crystal having a YbFe$_2$O$_4$ type crystal structure which is a layered structure can be classified as a hexagonal system, and in a unit cell thereof, the a-axis and the b-axis are parallel to the plane direction of the layer and the c-axis is orthogonal to the layer (i.e., the a-axis and the b-axis).

In an image obtained with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image of the nc-OS film observed with a TEM, for example, a crystal grain boundary cannot be clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS film. Thus, the orientation in the whole film is not observed. Accordingly, the nc-OS film cannot be distinguished from an amorphous oxide semiconductor depending on the analysis method. For example, when the nc-OS film is subjected to structural analysis by an out-of-plane method with an XRD apparatus using an X-ray having a diameter larger than the diameter of a crystal part, a peak indicating a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the size of a crystal part. Meanwhile, in some cases, a circular (ring-like) region with high luminance is observed in an electron diffraction pattern (also referred to as nano-beam electron diffraction pattern) of the nc-OS film, which is obtained using an electron beam with a probe diameter close to or smaller than the diameter of a crystal part (e.g., 1 nm or larger and 30 nm or smaller), and spots are observed in the ring-like region.

The nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film. Thus, the nc-OS film has a higher carrier concentration and higher electron mobility than the CAAC-OS film in some cases. Accordingly, a transistor including the nc-OS film may have high field-effect mobility.

The nc-OS film can be formed at a smaller oxygen flow rate ratio in deposition than the CAAC-OS film. The nc-OS film can also be formed at a lower substrate temperature in deposition than the CAAC-OS film. For example, the nc-OS film can be deposited at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (In:Ga:Zn=4:2: 4.1 [atomic ratio]) at a substrate temperature higher than or equal to 100° C. and lower than or equal to 130° C. is likely to have either the nc (nano crystal) structure or the CAAC structure, or a structure in which both structures are mixed. By contrast, a metal oxide formed at a substrate temperature set at room temperature (R.T.) is likely to have the nc structure. Note that room temperature (R.T.) here also includes a temperature in the case where a substrate is not heated intentionally.

[Composition of Metal Oxide]

The composition of a CAC (Cloud-Aligned Composite)-OS that can be used in a transistor disclosed in one embodiment of the present invention will be described below.

Note that a CAAC (c-axis aligned crystal) refers to an example of a crystal structure, and a CAC (Cloud-Aligned Composite) refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

The above is the description of the composition of the metal oxide.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, an example of a display device that includes any of the transistors described in the above embodiment will be described.

Structure Example

FIG. 11A is a top view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chips can each be mounted on the first substrate 701 or the FPC 716.

The transistor of one embodiment of the present invention can be used as the transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 11B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 11B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 11B. When part of the resin layer 743 is bent backward, the display device 700A can be mounted on an electronic device while the FPC 716 overlaps with the back side of the pixel portion 702; thus, the electronic device can be downsized.

An IC 717 is mounted on the FPC 716 connected to the display device 700A. The IC 717 functions as a source driver circuit, for example. In this case, the source driver circuit portion 704 in the display device 700A can include at least one of a protection circuit, a buffer circuit, a demultiplexer circuit, and the like.

A display device 700B illustrated in FIG. 11C is a display device that can be suitably used for an electronic device with a large screen. For example, the display device 700B can be suitably used for a television device, a monitor device, a personal computer (including a notebook type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the first substrate 701. Thus, an electronic device with a narrow bezel can be achieved.

With such a structure, a large-size and high-resolution display device can be achieved. For example, a display device with a diagonal screen size of 30 inches or more, 40 inches or more, 50 inches or more, or 60 inches or more can be achieved. Furthermore, a display device with extremely high resolution such as 4K2K or 8K4K can be achieved.

Cross-Sectional Structure Example

Figure 12:
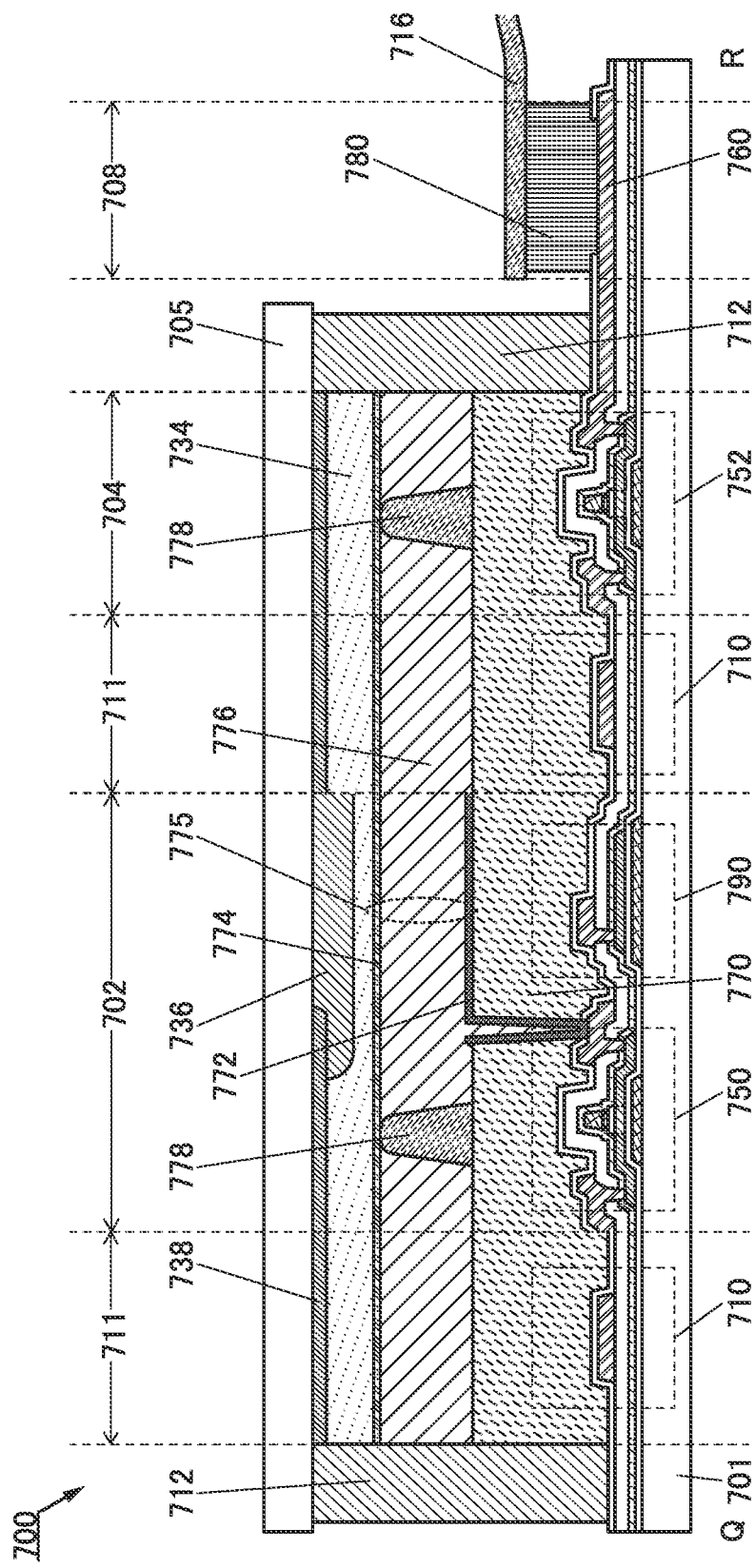
FIG. 12 is a cross-sectional view of a display device.
Figure 13:
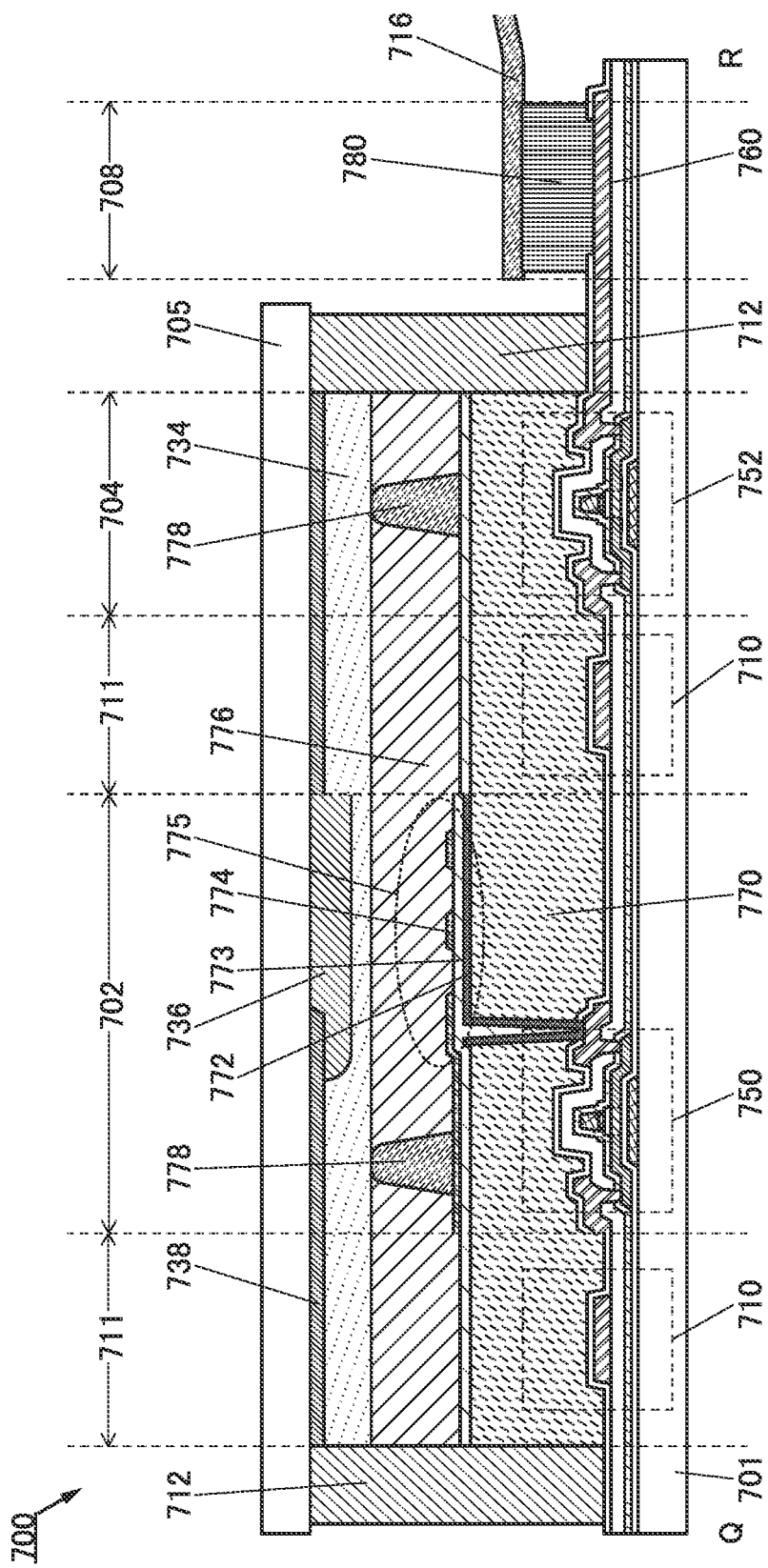
FIG. 13 is a cross-sectional view of a display device.
Figure 14:
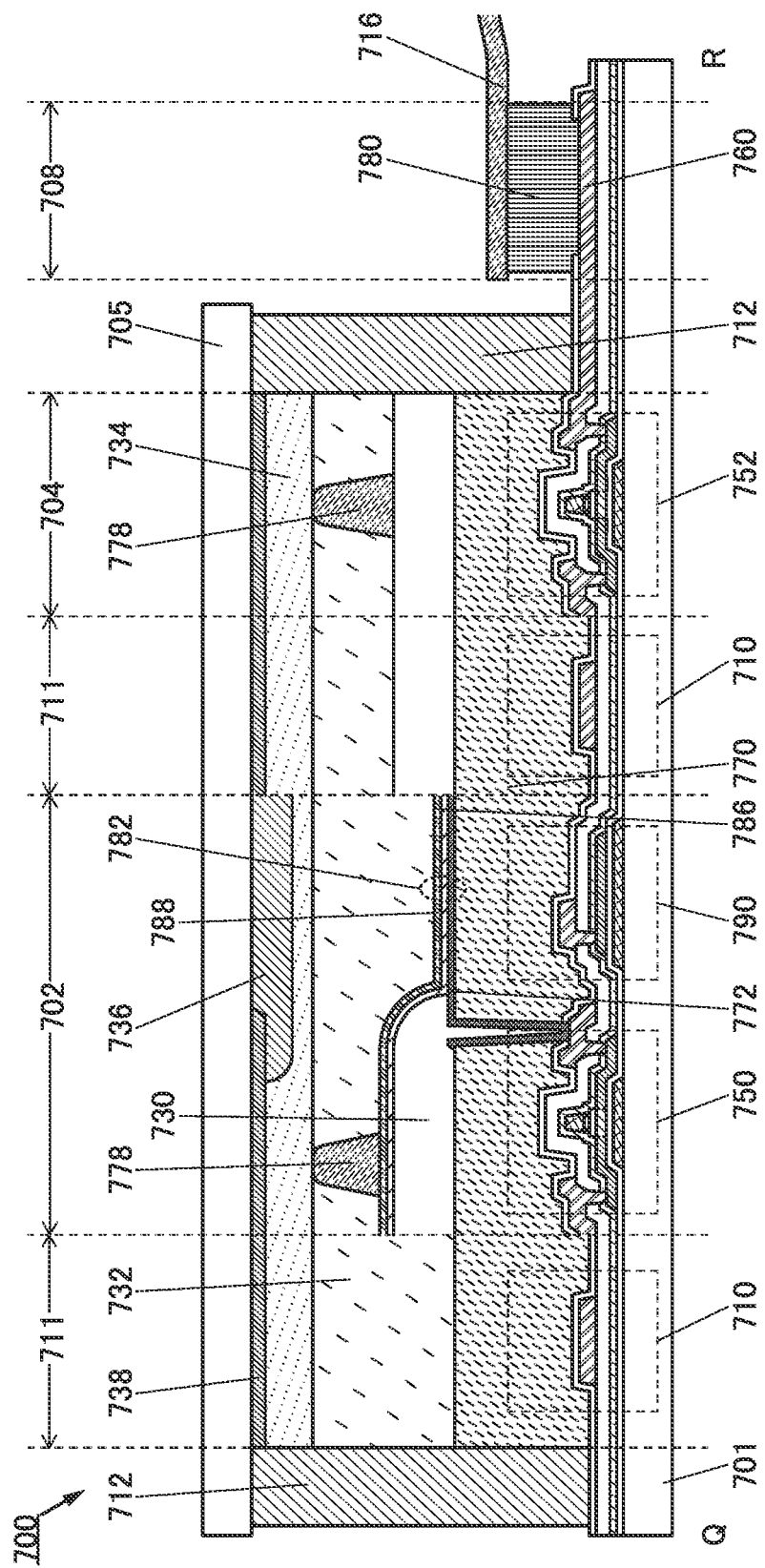
FIG. 14 is a cross-sectional view of a display device.
Figure 15:
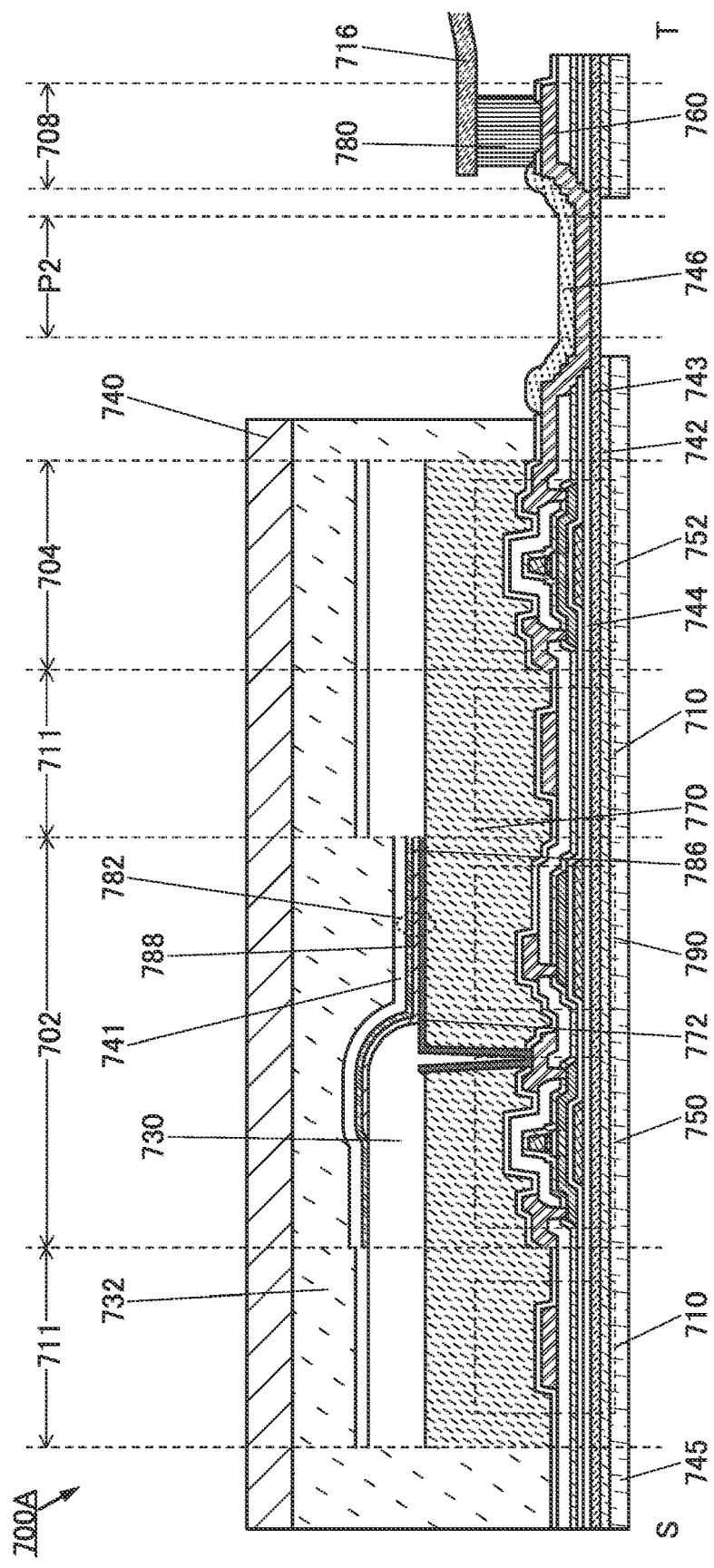
FIG. 15 is a cross-sectional view of a display device.

Structures using a liquid crystal element as a display element and structures using an EL element will be described below with reference to FIG. 12 to FIG. 15. Note that FIG. 12 to FIG. 14 are cross-sectional views taken along dashed-dotted line Q-R in FIG. 11A. FIG. 15 is a cross-sectional view taken along dashed-dotted line S-T illustrated in FIG. 11B. FIG. 12 and FIG. 13 are each a structure using a liquid crystal element as a display element, and FIG. 14 and FIG. 15 are each a structure using an EL element.

<Description of Common Portions in Display Devices>

Display devices in FIG. 12 to FIG. 15 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 13 illustrates a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal or the like can be set longer. Thus, frequency of refresh operation can be reduced, which leads to lower power consumption.

In addition, the transistor used in this embodiment can have relatively high field-effect mobility and thus is capable of high-speed operation. For example, with such a transistor capable of high-speed operation used for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 12, FIG. 14, and FIG. 15 includes a lower electrode formed by processing the same film as a first gate electrode included in the transistor 750 and an upper electrode formed by processing the same metal oxide film as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that the same can be said for the gate driver circuit portion 706, as the source driver circuit portion 704.

The signal line 710 is formed by processing the same conductive film as the source electrode, the drain electrode and the like of the transistor 750 and the transistor 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. The wiring 760 is formed by processing the same conductive film as the source electrode, the drain electrode, and the like of the transistor 750 and the transistor 752.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750, for example.

A light-blocking film 738, a coloring film 736, and an insulating film 734 in contact with these films are provided on the second substrate 705 side.

<Structure Example of Display Device Using Liquid Crystal Element>

The display device 700 illustrated in FIG. 12 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode. A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. When a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided so that the liquid crystal element is placed therebetween.

The display device 700 in FIG. 13 is an example of employing the liquid crystal element 775 of a horizontal electric field mode (e.g., an FFS mode). The conductive layer 774 functioning as a common electrode is provided over the conductive layer 772 with an insulating layer 773 therebetween. An electric field generated between the conductive layer 772 and the conductive layer 774 can control the alignment state in the liquid crystal layer 776.

In FIG. 13, a storage capacitor can be formed with a stacked-layer structure including the conductive layer 774, the insulating layer 773, and the conductive layer 772. Thus, another capacitor need not be provided, and thus the aperture ratio can be increased.

Although not illustrated in FIG. 12 and FIG. 13, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plano-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

In addition, a scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

<Display Device Using Light-Emitting Element>

The display device 700 illustrated in FIG. 14 includes a light-emitting element 782. The light-emitting element 782 includes the conductive layer 772, an EL layer 786, and a conductive film 788. The EL layer 786 contains a light-emitting material such as an organic compound or an inorganic compound.

A fluorescent material, a phosphorescent material, a thermally activated delayed fluorescence (TADF) material or an inorganic compound (a quantum dot material or the like) can be used for the light-emitting material.

In the display device 700 illustrated in FIG. 14, an insulating film 730 covering part of the conductive layer 772 is provided over the planarization insulating film 770. Here, the light-emitting element 782 is a top-emission light-emitting element, which includes the conductive film 788 with a light-transmitting property and emits light to the conductive film 788 side. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782, and the light-blocking film 738 is provided in the lead wiring portion 711, the source driver circuit portion 704, and a position overlapping with the insulating film 730. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by separate coloring.

FIG. 15 illustrates a structure of a display device suitably applicable to a flexible display. FIG. 15 is a cross-sectional view taken along the dashed-dotted line S-T in the display device 700A in FIG. 11B.

The display device 700A in FIG. 15 has a structure in which a support substrate 745, a bonding layer 742, the resin layer 743, and an insulating layer 744 are stacked instead of the first substrate 701 in FIG. 14. The transistor 750, the capacitor 790, and the like are provided over the insulating layer 744 over the resin layer 743.

The support substrate 745 includes an organic resin, glass, or the like and is thin enough to have flexibility. The resin layer 743 is a layer containing an organic resin such as polyimide or acrylic. The insulating layer 744 includes an inorganic insulating film of silicon oxide, silicon oxynitride, silicon nitride, or the like. The resin layer 743 and the support substrate 745 are attached to each other with the bonding layer 742. The resin layer 743 is preferably thinner than the support substrate 745.

The display device 700A in FIG. 15 includes a protective layer 740 instead of the second substrate 705 in FIG. 14. The protective layer 740 is attached to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layers 786 are formed separately so that respective subpixels emit light of different colors, whereby color display can be performed without use of the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 15 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

<Structure Example of Display Device Provided with Input Device>

An input device may be provided in the display device 700 or the display device 700A illustrated in FIG. 12 to FIG. 15. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include what is called an in-cell touch panel in which an input device is provided between a pair of substrates, what is called an on-cell touch panel in which an input device is formed over the display device 700, or what is called an out-cell touch panel in which an input device is attached to the display device 700.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 3

In this embodiment, a display device that includes the semiconductor device of one embodiment of the present invention will be described with reference to FIG. 16.

Figure 16A:
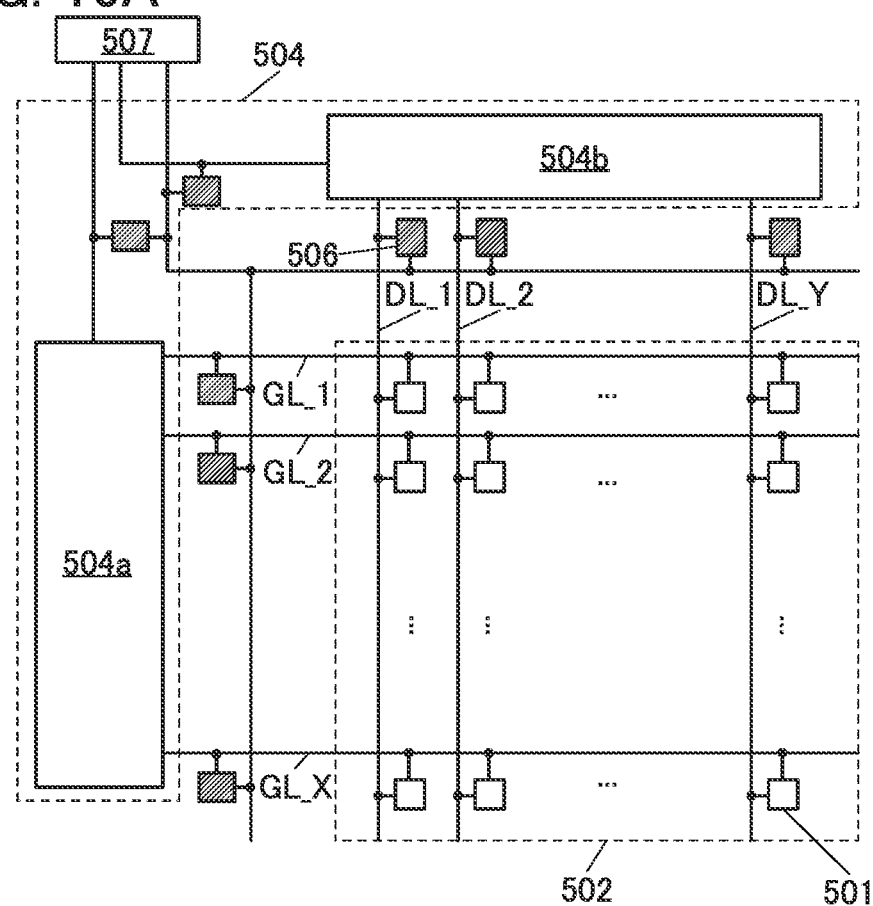
FIG. 16A is a block diagram of a display device.

A display device illustrated in FIG. 16A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The transistor of one embodiment of the present invention may also be used in the protection circuits 506.

The pixel portion 502 includes a plurality of pixel circuits 501 that drive a plurality of display elements arranged in X rows and Y columns (X and Y each independently represent a natural number of 2 or more).

The driver circuit portion 504 includes driver circuits such as a gate driver 504a that outputs a scanning signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 shown in FIG. 16A is connected to a variety of wirings such as the gate lines GL that are wirings between the gate driver 504a and the pixel circuits 501 and the data lines DL that are wirings between the source driver 504b and the pixel circuits 501, for example.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

Figure 16B:
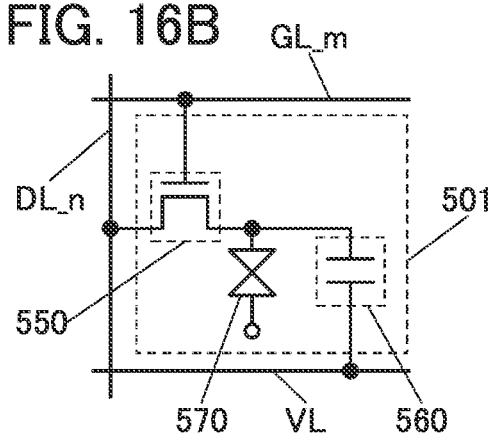
FIG. 16B and FIG. 16C are circuit diagrams of the display device.
Figure 16C:
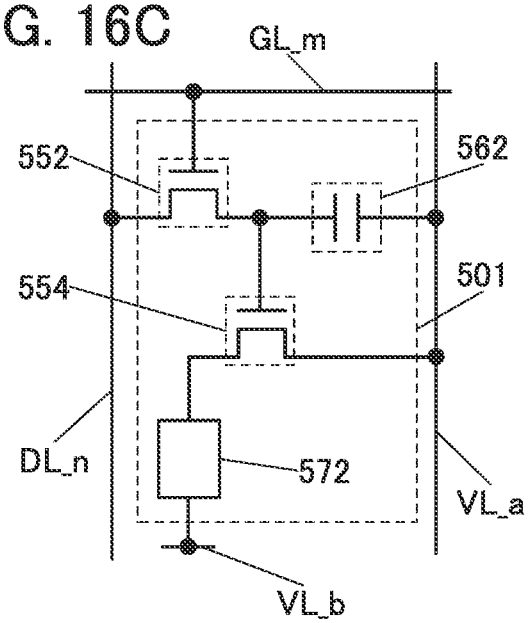

The plurality of pixel circuits 501 illustrated in FIG. 16A can have a configuration illustrated in FIG. 16B or FIG. 16C, for example.

The pixel circuit 501 illustrated in FIG. 16B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a potential supplied to one of the pair of electrodes of the liquid crystal element 570 of the pixel circuit 501 may differ between rows.

The pixel circuit 501 illustrated in FIG. 16C includes a transistor 552 and a transistor 554, a capacitor 562, and a light-emitting element 572. The data line DL_n, the gate line GL_m, a potential supply line VL_a, potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with any of the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

[Circuit Configuration]

Figure 17A:
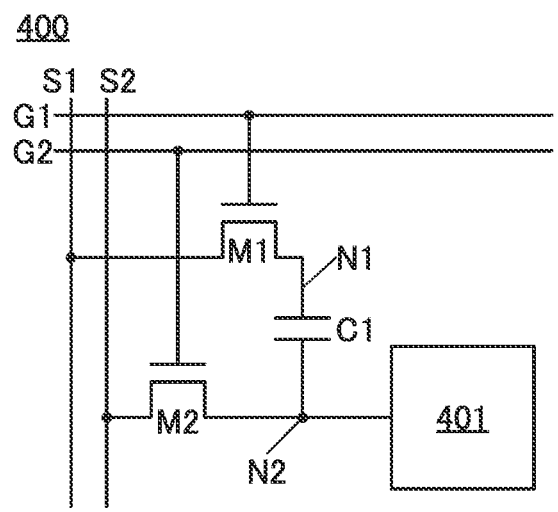
FIG. 17A, FIG. 17C, and FIG. 17D are circuit diagrams of display devices.

FIG. 17A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 17B:
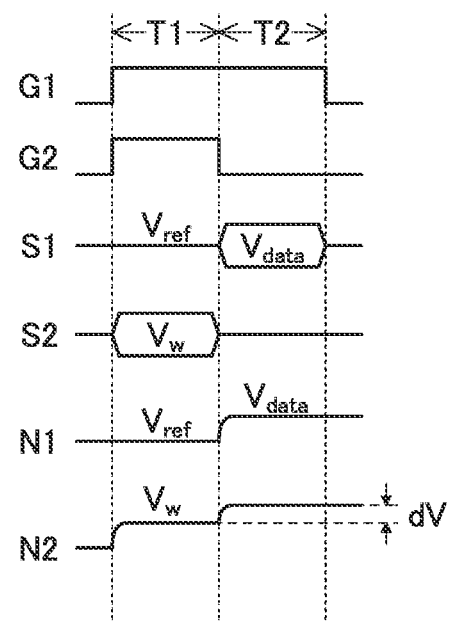
FIG. 17B is a timing chart.

Next, an example of a method for operating the pixel circuit 400 is described with reference to FIG. 17B. FIG. 17B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 17B, one frame period is divided into a period T1 and a period T2. The period T1 is a period in which a potential is written to the node N2, and the period T2 is a period in which a potential is written to the node N1.

<Period T1>

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w-V_{ref}$ is retained in the capacitor C1.

<Period T2>

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although dV is shown as a positive value in FIG. 17B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case where a light-emitting element is used, high-dynamic range (HDR) display or the like can be performed. In the case where a liquid crystal element is used, overdriving or the like can be achieved.

Application Examples

<Example Using Liquid Crystal Element>

Figure 17C:
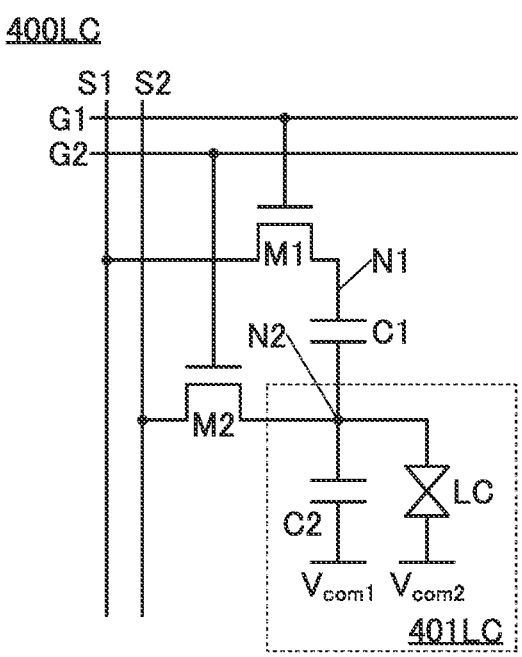

A pixel circuit 400LC illustrated in FIG. 17C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

<Example Using Light-Emitting Element>

Figure 17D:
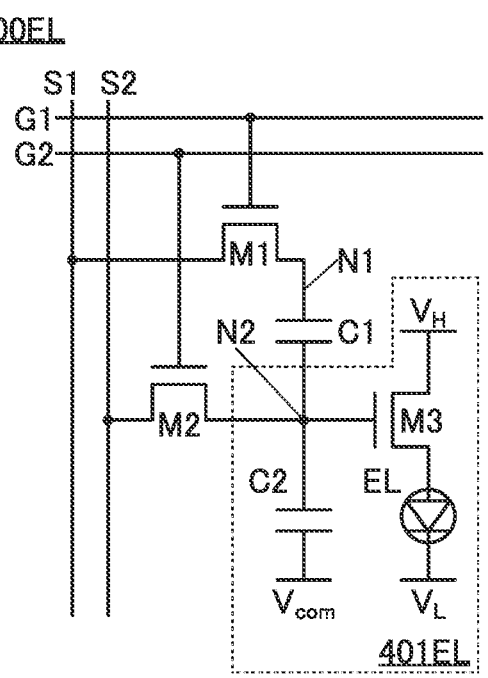

A pixel circuit 400EL illustrated in FIG. 17D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential VL.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is supplied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits illustrated in FIG. 17C and FIG. 17D, and a configuration to which a transistor, a capacitor, or the like is further added may be employed.

At least part of this embodiment can be implemented in combination with any of the other embodiments described in this specification as appropriate.

Embodiment 5

In this embodiment, a display module that can be fabricated using one embodiment of the present invention will be described.

Figure 18A:
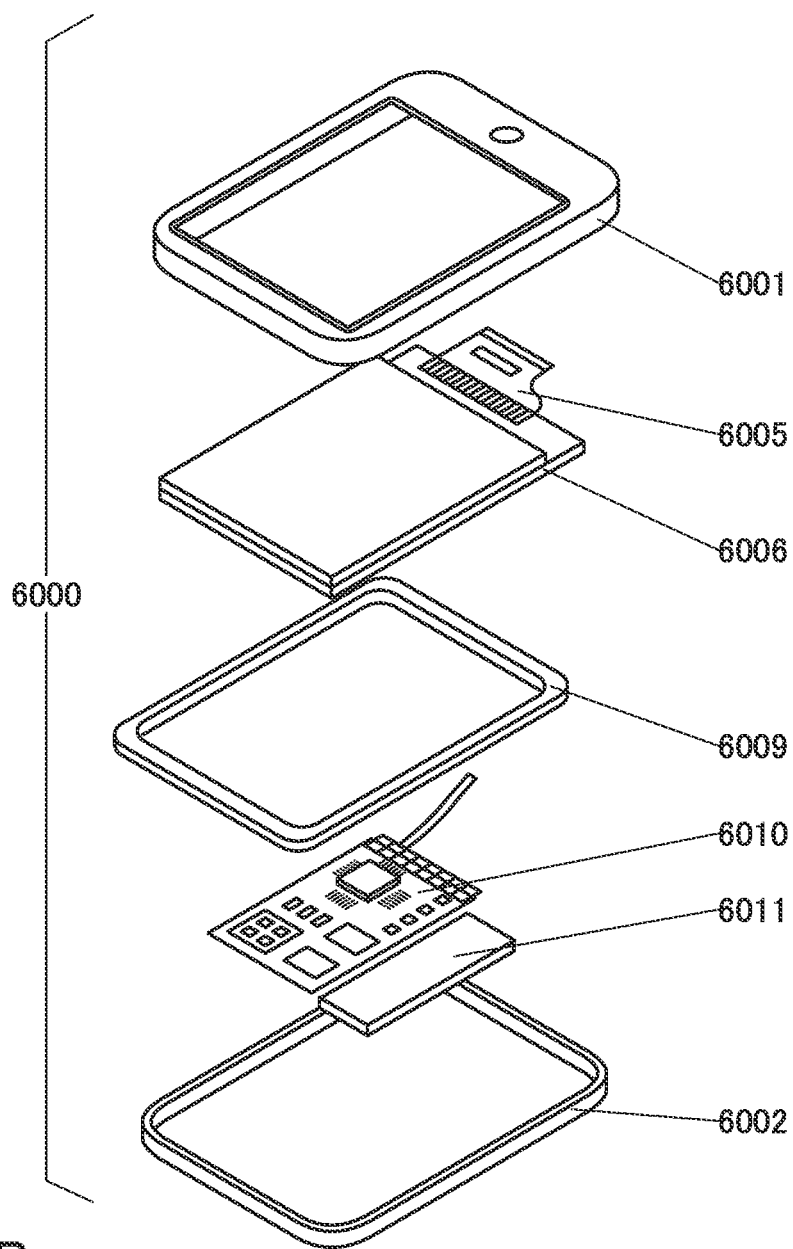
FIG. 18A and FIG. 18B illustrate a structure example of a display module.

In a display module 6000 illustrated in FIG. 18A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 18B:
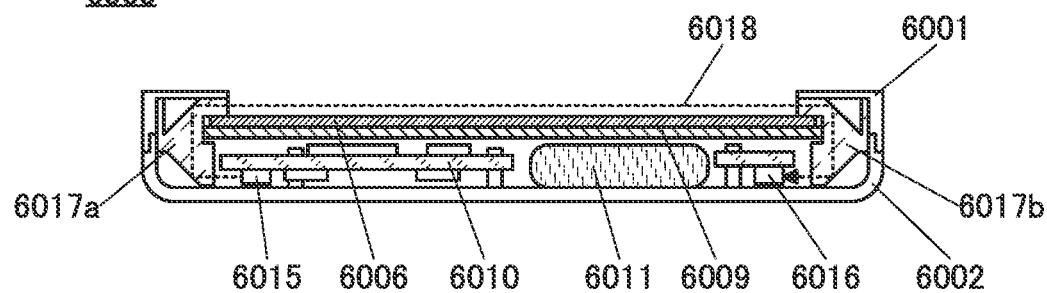

FIG. 18B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017*a* and a light guide portion 6017*b*) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017*a* and the light guide portion 6017*b*.

Light 6018 emitted from the light-emitting portion 6015 travels over the display device 6006 through the light guide portion 6017*a* and reaches the light-receiving portion 6016 through the light guide portion 6017*b*. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

With the use of the light guide portion 6017*a* and the light guide portion 6017*b* which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin that absorbs visible light and transmits infrared rays is used, a malfunction of the touch sensor can be suppressed more effectively.

At least part of this embodiment can be implemented in combination with any of the other embodiments described in this specification as appropriate.

Embodiment 6

In this embodiment, examples of an electronic device for which the display device of one embodiment of the present invention can be used will be described.

Figure 19A:
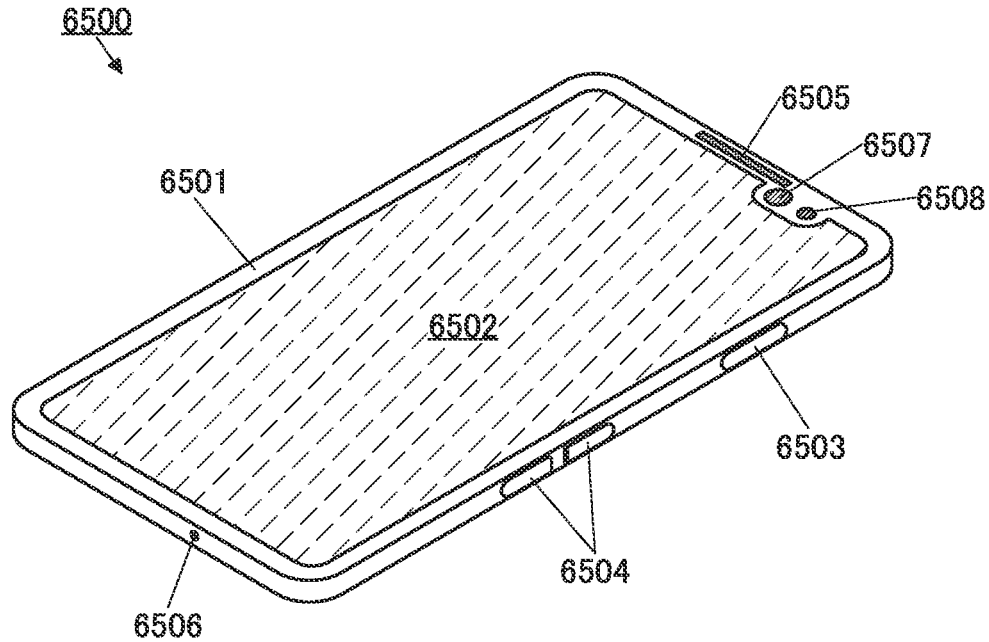
FIG. 19A and FIG. 19B illustrate a structure example of an electronic device.

An electronic device 6500 illustrated in FIG. 19A is a portable information terminal that can be used as a smartphone.

The electronic device 6500 includes, in a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 19B:
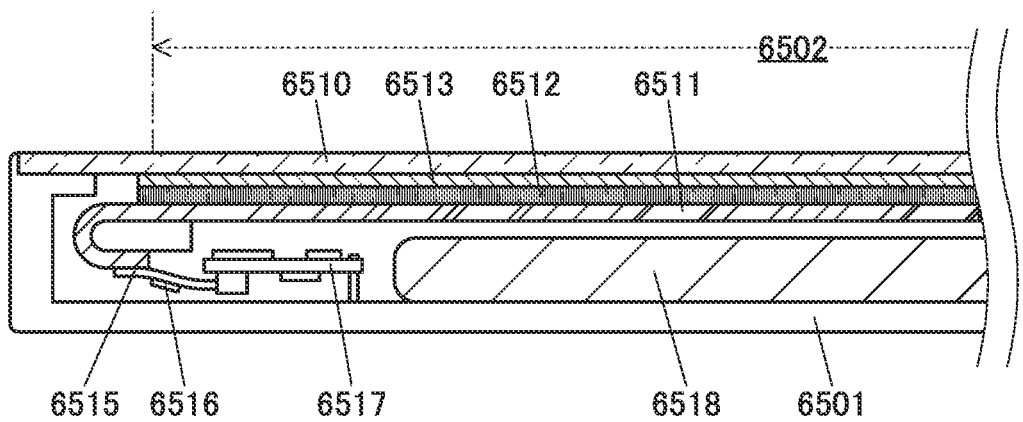

FIG. 19B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved. Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be achieved.

At least part of this embodiment can be implemented in combination with any of the other embodiments described in this specification as appropriate.

Embodiment 7

In this embodiment, electronic devices each including a display device fabricated using one embodiment of the present invention are described.

Electronic devices described below are each provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more.

Examples of electronic devices include electronic devices having relatively large screens, such as a television device, a laptop personal computer, a monitor, digital signage, a pachinko machine, and a game machine; a digital camera; a digital video camera; a digital photo frame; a mobile phone; a portable game console; a portable information terminal; an audio reproducing device; and the like.

The electronic device using one embodiment of the present invention can be incorporated along a flat surface or a curved surface of an inside or outside wall surface of a house or a building, an interior or exterior surface of a car, or the like.

Figure 20A:
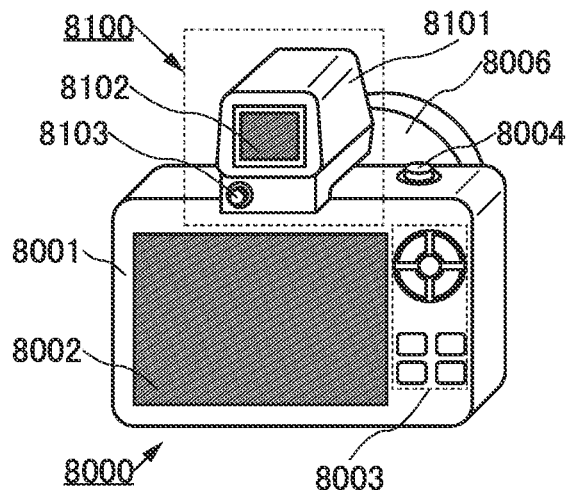
FIG. 20A to FIG. 20E are structure examples of electronic devices.

FIG. 20A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000.

Note that the lens 8006 may be included in the housing of the camera 8000.

Images can be taken with the camera 8000 at the press of the shutter button 8004 or the touch of the display portion 8002 functioning as a touch panel.

The housing 8001 includes a mount including an electrode, so that the finder 8100, a stroboscope, or the like can be connected.

The finder 8100 includes a housing 8101, a display portion 8102, a button 8103, and the like.

The housing 8101 is attached to the camera 8000 by a mount for engagement with the mount of the camera 8000. In the finder 8100, an image or the like received from the camera 8000 can be displayed on the display portion 8102.

The button 8103 has a function of a power supply button and the like.

A display device of one embodiment of the present invention can be used in the display portion 8002 of the camera 8000 and the display portion 8102 of the finder 8100. Note that a finder may be incorporated in the camera 8000.

Figure 20B:
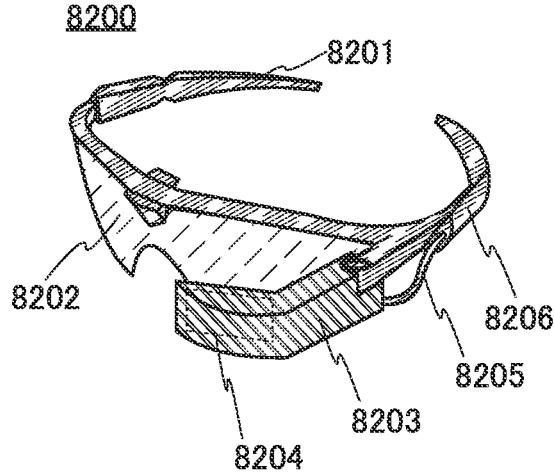

FIG. 20B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive image data and display it on the display portion 8204. The main body 8203 includes a camera, and the movement of the eyeballs or the eyelids of the user can be used as an input means.

The mounting portion 8201 may include a plurality of electrodes capable of sensing current flowing with the movement of the user's eyeball at a position in contact with the user to recognize the user's sight line. The mounting portion 8201 may have a function of monitoring the user's pulse with the use of current flowing in the electrodes. The mounting portion 8201 may include sensors such as a temperature sensor, a pressure sensor, and an acceleration sensor so that the user's biological information can be displayed on the display portion 8204 and an image displayed on the display portion 8204 can be changed in accordance with the movement of the user's head.

A display device of one embodiment of the present invention can be used in the display portion 8204.

Figure 20C:
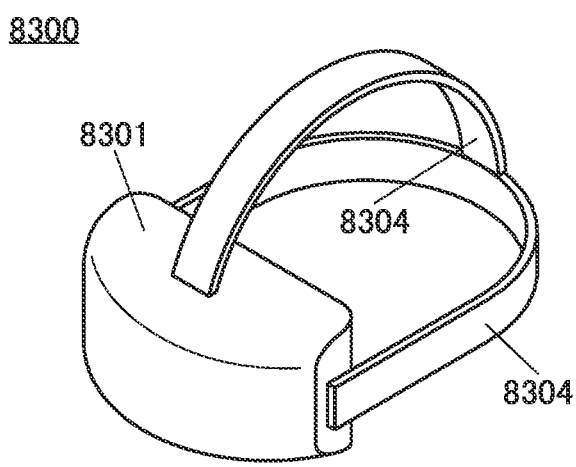
Figure 20D:
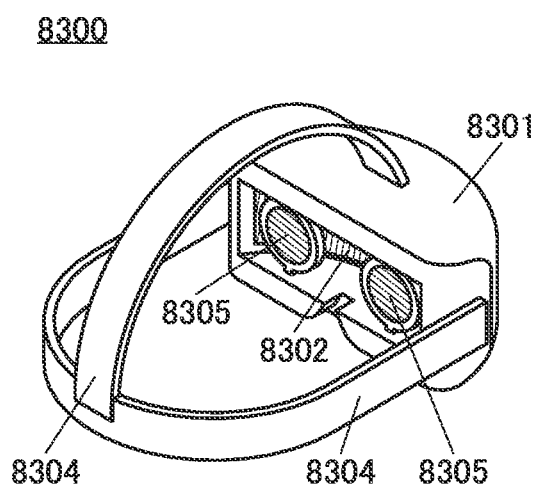
Figure 20E:
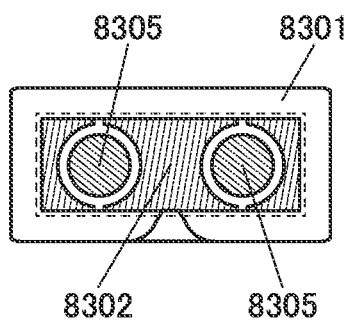

FIG. 20C, FIG. 20D and FIG. 20E are external views of a head-mounted display 8300. The head-mounted display 8300 includes a housing 8301, a display portion 8302, a fixing band 8304, and a pair of lenses 8305.

A user can see display on the display portion 8302 through the lenses 8305. The display portion 8302 is preferably curved because the user can feel high realistic sensation of images. Another image displayed in another region of the display portion 8302 is viewed through the lenses 8305, so that three-dimensional display using parallax or the like can be performed. The number of the display portions 8302 is not limited to one; two display portions 8302 may be provided for user's respective eyes.

A display device of one embodiment of the present invention can be used in the display portion 8302. A display device including a semiconductor device of one embodiment of the present invention has an extremely high resolution; thus, even when an image is magnified using the lenses 8305 as illustrated in FIG. 20E, the user does not perceive pixels, and thus a more realistic image can be displayed.

Electronic devices illustrated in FIG. 21A to FIG. 21G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices illustrated in FIG. 21A to FIG. 21G have a variety of functions, such as a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of reading a program or data stored in a storage medium and processing the program or data, and the like. Note that the electronic devices can have a variety of functions without limitation to the above. The electronic devices may each include a plurality of display portions. The electronic devices may each be provided with a camera or the like and have a function of taking a still image or a moving image, a function of storing the taken image in a storage medium (an external memory medium or a memory medium incorporated in the camera), a function of displaying the taken image on the display portion, or the like.

The electronic devices in FIG. 21A to FIG. 21G are described in detail below.

Figure 21A:
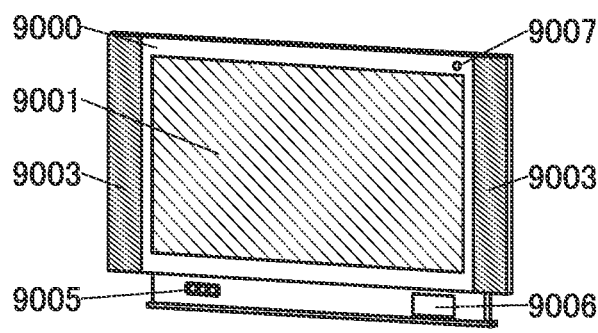
FIG. 21A to FIG. 21G are structure examples of electronic devices.

FIG. 21A is a perspective view illustrating a television device 9100. The television device 9100 can include the display portion 9001 having a large screen size of for example, 50 inches or more, or 100 inches or more.

Figure 21D:
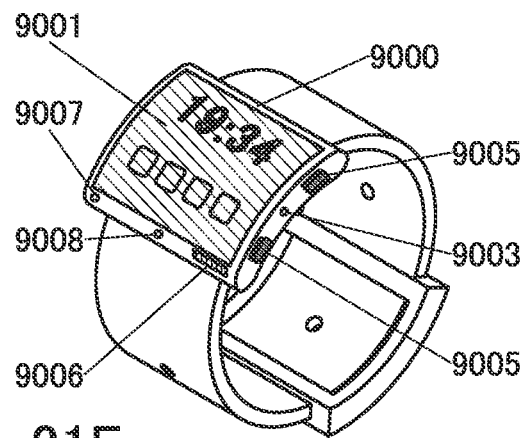
Figure 21B:
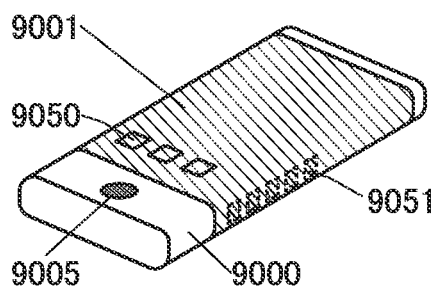

FIG. 21B is a perspective view of a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. In FIG. 21B, three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed at the position where the information 9051 is displayed.

Figure 21E:
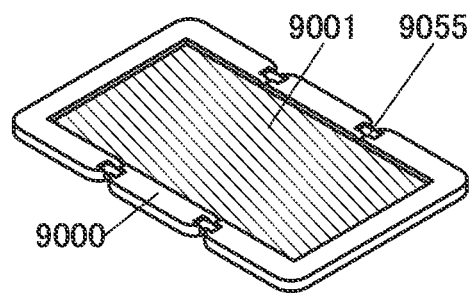
Figure 21C:
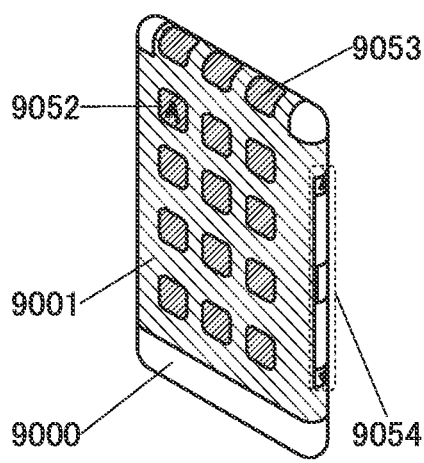

FIG. 21C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

FIG. 21D is a perspective view of a watch-type portable information terminal 9200. The display surface of the display portion 9001 is bent, and an image can be displayed on the bent display surface. Furthermore, for example, mutual communication between the portable information terminal 9200 and a headset capable of wireless communication can be performed, and thus hands-free calling is possible. The connection terminal 9006 of the portable information terminal 9200 allows mutual data transmission with another information terminal and charging. Note that the charging operation may be performed by wireless power feeding.

Figure 21F:
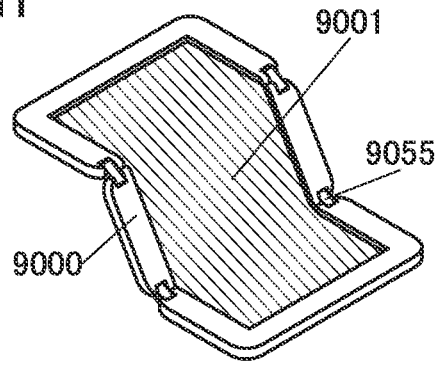
Figure 21G:
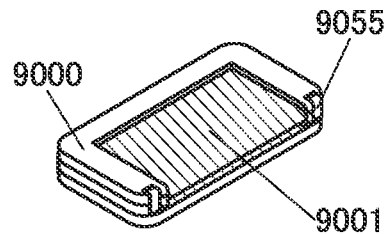

FIG. 21E, FIG. 21F, and FIG. 21G are perspective views of a foldable portable information terminal 9201. FIG. 21E is a perspective view illustrating the portable information terminal 9201 that is opened. FIG. 21G is a perspective view illustrating the portable information terminal 9201 that is folded. FIG. 21F is a perspective view illustrating the portable information terminal 9201 that is shifted from one of the states in FIG. 21E and FIG. 21G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be bent with a radius of curvature of greater than or equal to 1 mm and less than or equal to 150 mm.

Figure 22A:
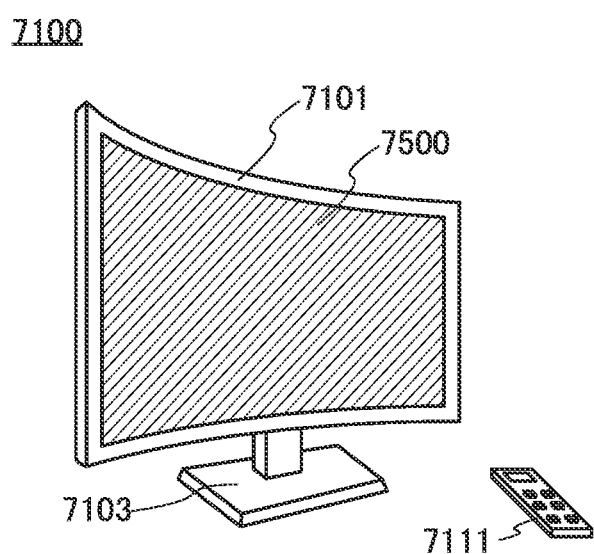
FIG. 22A to FIG. 22D are structure examples of electronic devices.

FIG. 22A illustrates an example of a television device. In a television device 7100, a display portion 7500 is incorporated in a housing 7101. Here, the housing 7101 is supported by a stand 7103.

The television device 7100 illustrated in FIG. 22A can be operated with an operation switch provided in the housing 7101 or a separate remote controller 7111. Alternatively, a touch panel may be used in the display portion 7500 so that the television device 7100 can be operated by touching the touch panel. The remote controller 7111 may be provided with a display portion in addition to operation buttons.

Note that the television device 7100 may include a television receiver and a communication device for a network connection.

Figure 22B:
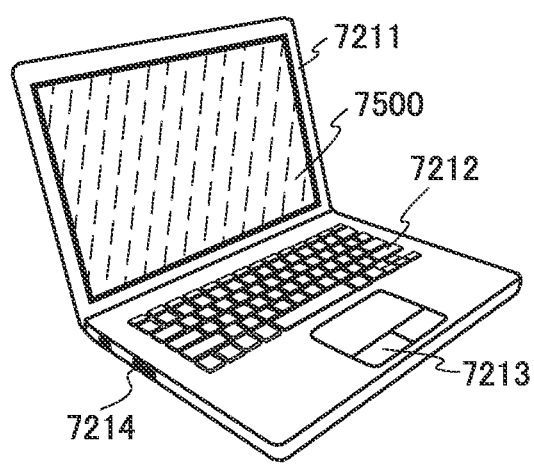

FIG. 22B illustrates a laptop personal computer 7200. The laptop personal computer 7200 includes a housing 7211, a keyboard 7212, a pointing device 7213, an external connection port 7214, and the like. In the housing 7211, the display portion 7500 is incorporated.

Figure 22C:
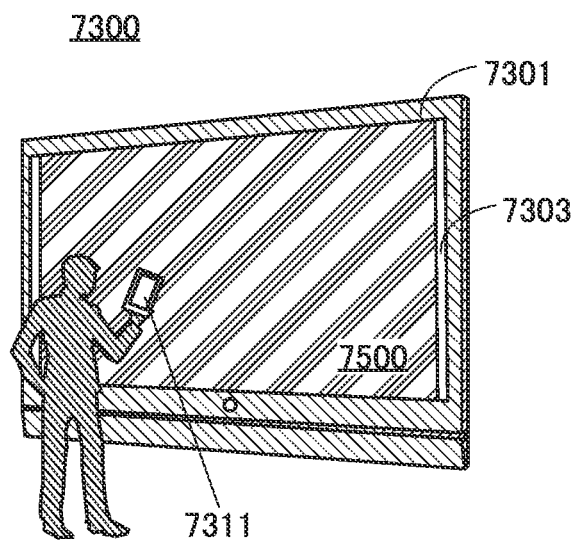
Figure 22D:
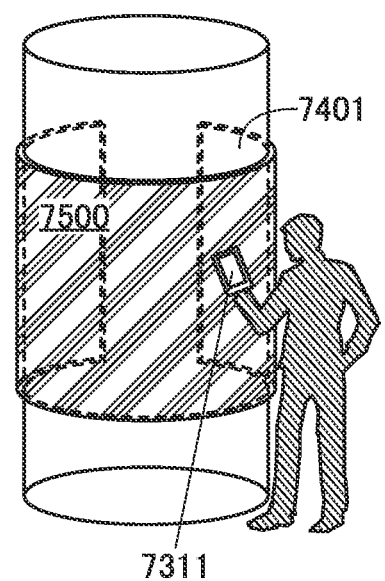

FIG. 22C and FIG. 22D illustrate examples of digital signage.

A digital signage 7300 illustrated in FIG. 22C includes a housing 7301, the display portion 7500, a speaker 7303, and the like. The digital signage 7300 can also include an LED lamp, an operation key (including a power switch or an operation switch), a connection terminal, a variety of sensors, a microphone, and the like.

FIG. 22D illustrates a digital signage 7400 mounted on a cylindrical pillar 7401. The digital signage 7400 includes the display portion 7500 provided along a curved surface of the pillar 7401.

The larger display portion 7500 can provide a larger amount of information at a time and attract more attention, so that the effectiveness of the advertisement can be increased, for example.

A touch panel is preferably used in the display portion 7500 so that the user can operate the digital signage 7300 or the digital signage 7400. Thus, the digital signage 7300 or the digital signage 7400 can be used for not only advertising but also providing information that the user needs, such as route information, traffic information, and an information map of a commercial facility.

Furthermore, as illustrated in FIG. 22C and FIG. 22D, it is preferable that the digital signage 7300 or the digital signage 7400 work with an information terminal 7311 such as a user's smartphone through wireless communication. For example, advertisement displayed on the display portion 7500 can also be displayed on a screen of the information terminal 7311, or display on the display portion 7500 can be switched by operating the information terminal 7311.

Furthermore, it is possible to make the digital signage 7300 or the digital signage 7400 execute a game with the use of the information terminal 7311 as an operation means (controller). Thus, an unspecified number of people can join in and enjoy the game concurrently.

A display device of one embodiment of the present invention can be used in each of the display portions 7500 in FIG. 22A to FIG. 22D.

The electronic devices of this embodiment each include a display portion; however, one embodiment of the present invention can also be used in an electronic device without a display portion.

At least part of this embodiment can be implemented in combination with any of the other embodiments described in this specification as appropriate.

Example

In this example, the relation between the carrier concentration, the sheet resistance, and the Fermi level in an oxide semiconductor is described.

In general, it is known that the relation between a carrier concentration and a sheet resistance in a semiconductor is known to satisfy Formula (1) below, when n represents the carrier concentration, Rs represents the sheet resistance, e represents the elementary charge, p represents the mobility, and t represents the thickness.

[Formula 1]

$$n = \frac{1}{e\mu R_s t} \quad (1)$$

Figure 23A:
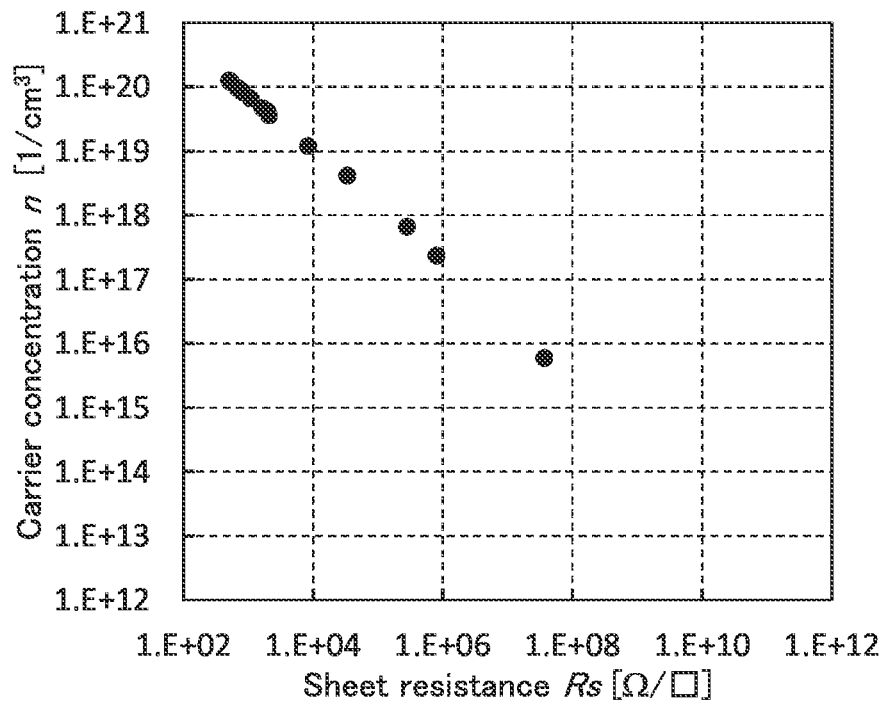
FIG. 23A and FIG. 23B are diagrams showing the relation between carrier concentration and sheet resistance.

FIG. 23A shows the measurement results of the carrier concentration n and the sheet resistance Rs of an oxide semiconductor film measured by Hall effect measurement.

Each data shown in FIG. 23A is a measurement value of an oxide semiconductor film deposited using a metal oxide sputtering target with a metal element composition of In:Zn:Ga=4:2:4.1 [atomic ratio]. In FIG. 23A, data of 18 types of samples having different carrier concentrations fabricated using different supply amounts of oxygen to the oxide semiconductor film and different temperature conditions of a subsequent bake treatment is plotted. The thickness of the oxide semiconductor film of each of the samples is approximately 40 nm.

Figure 23B:
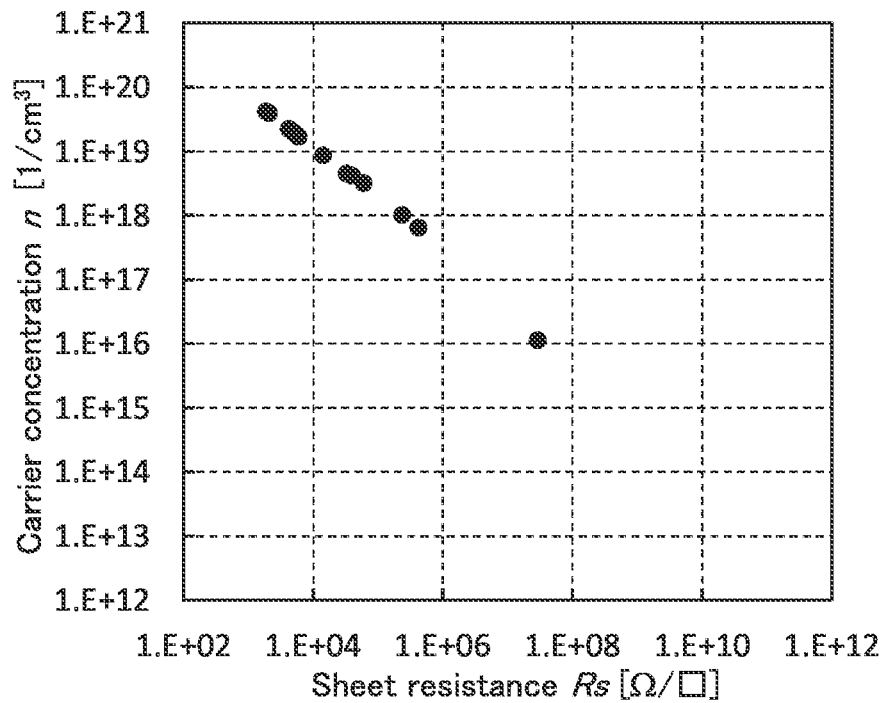

FIG. 23B shows measurement values of an oxide semiconductor film deposited using a metal oxide sputtering target with a metal element composition of In:Zn:Ga=1:1:1 [atomic ratio]. In FIG. 23B, data of 15 types of samples having different carrier concentrations is plotted, as in the above. The thickness of the oxide semiconductor film of each sample is approximately 40 nm.

An inversely proportional correlation that satisfies Formula (1) can be seen between the carrier concentration n and the sheet resistance Rs as shown both in FIG. 23A and FIG. 23B. In the relation between the carrier concentration n and the sheet resistance Rs, a similar tendency can be confirmed regardless of the composition of the oxide semiconductor film.

Next, the relation between the carrier concentration and the Fermi level in an oxide semiconductor is described.

Figure 24:
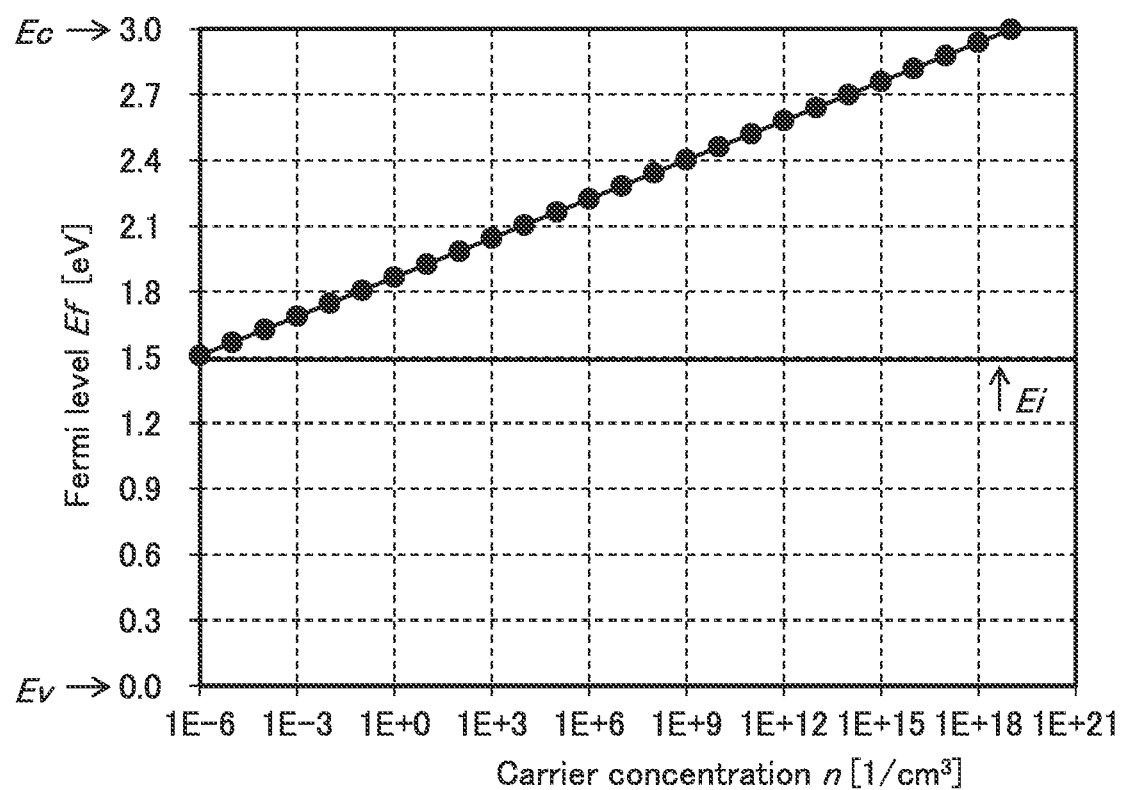
FIG. 24 is a diagram showing the relation between carrier concentration and the Fermi level.

FIG. 24 shows the relation between the carrier concentration n and a Fermi level Ef in an In—Ga—Zn oxide film with a metal element composition of In:Zn:Ga=4:2:3 [atomic ratio]. Here, the results of calculations performed at a temperature of 300 K are shown.

As shown in FIG. 24, the Fermi level Ef depends on the carrier concentration n and gets closer to the conduction band minimum (Ec) as the carrier concentration n increases. For example, in the case where the carrier concentration n is $1 \times 10^{12}$ cm$^{-3}$, the Fermi level Ef is lower than the conduction band minimum (Ec) by approximately 0.4 V. When the carrier concentration n is $1 \times 10^{-6}$ cm$^{-3}$, the Fermi level Ef is substantially the same as the intrinsic Fermi level (Ei).

Note that in the case where the In—Ga—Zn oxide film has a metal element composition of In:Zn:Ga=1:1:1 [atomic ratio], the carrier concentration in which the Fermi level Ef becomes substantially the same as the intrinsic Fermi level (Ei) is $1 \times 10^{-9}$ cm$^{-3}$.

In a transistor using an oxide semiconductor film, the standard of the carrier concentration (donor concentration) in the oxide semiconductor film for obtaining normally-off electrical characteristics is approximately $1 \times 10^{16}$ cm$^{-3}$ or lower; furthermore, when the carrier concentration is equal to or lower than the standard, the oxide semiconductor can be regarded as substantially intrinsic. According to FIG. 24, in the case where the carrier concentration n is $1 \times 10^{16}$ cm$^{-3}$, the Fermi level Ef is located near the conduction band minimum (Ec).

REFERENCE NUMERALS 10, 10A, 10B, 10C: transistor, 100, 100A: transistor, 102: substrate, 103: insulating layer, 103a, 103b, 103b1, 103b2, 103b3: insulating film, 106, 112, 120a, 120b: conductive layer, 108, 108a, 108b: semiconductor layer, 108C, 108L1, 108L2, 108N: region, 110, 116, 118: insulating layer, 110a, 110b, 110c, 110f: insulating film, 112f:

conductive film, 114: metal oxide layer, 114*f* metal oxide film, 115: insulating region, 140: resist mask, 141*a*, 141*b*, 142: opening.

The invention claimed is:

1. A semiconductor device comprising:
a semiconductor layer;
a first insulating layer;
a second insulating layer;
a metal oxide layer;
a conductive layer; and
an insulating region,
wherein the metal oxide layer is positioned between the first insulating layer and the conductive layer,
wherein the insulating region is adjacent to the metal oxide layer and is positioned between the first insulating layer and the conductive layer,
wherein the semiconductor layer comprises a first region, a second region, a third region, and a fourth region,
wherein the first region is in contact with the first insulating layer and overlaps with the metal oxide layer and the conductive layer with the first insulating layer therebetween,
wherein the second region is in contact with the first insulating layer and overlaps with the insulating region and the conductive layer with the first insulating layer therebetween,
wherein the third region is in contact with the first insulating layer,
wherein the fourth region is in contact with the second insulating layer,
wherein the insulating region has a different permittivity from the first insulating layer,
wherein the insulating region has a different permittivity from the second insulating layer, and
wherein the first region has the lowest hydrogen concentration and the fourth region has the highest hydrogen concentration among the first region, the second region, the third region, and the fourth region.

2. The semiconductor device according to claim 1,
wherein, in a plan view,
an end portion of the metal oxide layer is positioned inward from an end portion of the conductive layer, and
wherein the end portion of the conductive layer is positioned inward from an end portion of the first insulating layer.

3. The semiconductor device according to claim 2,
wherein the first insulating layer, the metal oxide layer and the conductive layer are processed using the same resist mask.

4. The semiconductor device according to claim 1,
wherein the insulating region comprises a space, and
wherein the space is filled with a gas.

5. The semiconductor device according to claim 1,
wherein the first region has the lowest carrier concentration and the fourth region has the highest carrier concentration among the first region, the second region, the third region, and the fourth region.

6. A semiconductor device comprising:
a semiconductor layer;
a first insulating layer;
a second insulating layer;
a metal oxide layer;
a conductive layer;
an insulating region; and
a third insulating layer and a fourth insulating layer,
wherein the metal oxide layer is positioned between the first insulating layer and the conductive layer,
wherein the insulating region is adjacent to the metal oxide layer and is positioned between the first insulating layer and the conductive layer,
wherein the semiconductor layer comprises a first region, a second region, a third region, and a fourth region,
wherein the first region is in contact with the first insulating layer and overlaps with the metal oxide layer and the conductive layer with the first insulating layer therebetween,
wherein the second region is in contact with the first insulating layer and overlaps with the insulating region and the conductive layer with the first insulating layer therebetween,
wherein the third region is in contact with the first insulating layer,
wherein the fourth region is in contact with the second insulating layer,
wherein the insulating region has a different permittivity from the first insulating layer, and
wherein the insulating region has a different permittivity from the second insulating layer,
wherein the third insulating layer comprises a region overlapping with the first insulating layer with the semiconductor layer therebetween,
wherein the fourth insulating layer comprises a region overlapping with the semiconductor layer with the third insulating layer therebetween,
wherein the third insulating layer comprises an oxide, and
wherein the fourth insulating layer comprises a nitride.

7. The semiconductor device according to claim 6,
wherein the fourth insulating layer comprises a portion in contact with the second insulating layer in a region not overlapping with the semiconductor layer.

* * * * *